(12) United States Patent
Tanaka et al.

(10) Patent No.: US 8,580,700 B2
(45) Date of Patent: Nov. 12, 2013

(54) METHOD FOR MANUFACTURING SEMICONDUCTOR DEVICE

(75) Inventors: Koichiro Tanaka, Isehara (JP);
Hirotada Oishi, Atsugi (JP)

(73) Assignee: Semiconductor Energy Laboratory Co., Ltd., Atsugi-shi, Kanagawa-ken (JP)

(*) Notice: Subject to any disclaimer, the term of this patent is extended or adjusted under 35 U.S.C. 154(b) by 611 days.

(21) Appl. No.: 11/702,082

(22) Filed: Feb. 5, 2007

(65) Prior Publication Data

US 2007/0197049 A1    Aug. 23, 2007

(30) Foreign Application Priority Data

Feb. 17, 2006 (JP) .................. 2006-041292

(51) Int. Cl.
*H01L 21/00* (2006.01)

(52) U.S. Cl.
USPC .............................. 438/795; 438/99; 438/487

(58) Field of Classification Search
USPC .................... 438/99, 487, 795–799
See application file for complete search history.

(56) References Cited

U.S. PATENT DOCUMENTS

| | | | |
|---|---|---|---|
| 4,468,084 A * | 8/1984 | Hutcheson et al. | 385/14 |
| 5,278,679 A * | 1/1994 | Davis et al. | 359/19 |
| 5,684,617 A | 11/1997 | Langhans | |
| 5,691,541 A * | 11/1997 | Ceglio et al. | 250/492.1 |
| 6,031,201 A * | 2/2000 | Amako et al. | 219/121.68 |
| 6,376,799 B1 | 4/2002 | Amako et al. | |
| 6,462,307 B1 | 10/2002 | Hennig et al. | |
| 6,548,820 B1 * | 4/2003 | Mermelstein | 250/550 |
| 6,635,850 B2 | 10/2003 | Amako et al. | |
| 6,870,554 B2 | 3/2005 | Jain | |
| 6,897,405 B2 * | 5/2005 | Cheng et al. | 219/121.71 |
| 6,897,889 B2 | 5/2005 | Tanaka | |
| 7,068,414 B2 | 6/2006 | Sunagawa et al. | |
| 7,094,452 B2 | 8/2006 | Yamashita et al. | |
| 7,127,810 B2 | 10/2006 | Kasuga et al. | |
| 7,180,575 B2 | 2/2007 | Kazumi et al. | |

(Continued)

FOREIGN PATENT DOCUMENTS

| | | |
|---|---|---|
| CN | 1453636 | 11/2003 |
| EP | 0656241 A | 6/1995 |

(Continued)

OTHER PUBLICATIONS

International Search Report (Application No. PCT/JP2007/051322) Dated May 1, 2007.

(Continued)

*Primary Examiner* — Leonard Chang
(74) *Attorney, Agent, or Firm* — Eric J. Robinson; Robinson Intellectual Property Law Office, P.C.

(57) ABSTRACT

To provide a method for manufacturing a semiconductor device using a method in which a desired position is rapidly subjected to laser irradiation while switching laser irradiation patterns. With respect to an organic memory element having a structure in which an organic compound layer is interposed between a pair of conductive layers, data is written to the organic memory element by laser irradiation using a laser irradiation apparatus. Further, a laser beam emitted from a laser oscillator is split by a diffractive optical element into a plurality of laser beams, thereby irradiating a plurality of portions on the organic compound layer with laser beams by single irradiation.

18 Claims, 19 Drawing Sheets

(56) References Cited

U.S. PATENT DOCUMENTS

| | | |
|---|---|---|
| 7,183,148 B2 | 2/2007 | Yazaki et al. |
| 7,259,039 B2 | 8/2007 | Lan et al. |
| 7,499,305 B2 | 3/2009 | Nomura et al. |
| 7,504,327 B2 | 3/2009 | Yamazaki et al. |
| 7,526,858 B2 | 5/2009 | Kasuga et al. |
| 7,532,378 B2 | 5/2009 | Tanaka et al. |
| 7,542,129 B2 | 6/2009 | Sandstrom |
| 2002/0021426 A1* | 2/2002 | Mei et al. ............. 355/53 |
| 2002/0105733 A1* | 8/2002 | Hendriks et al. ........ 359/719 |
| 2002/0164069 A1 | 11/2002 | Nagano |
| 2004/0065643 A1 | 4/2004 | Tanaka |
| 2004/0074881 A1 | 4/2004 | Oishi |
| 2004/0182831 A1 | 9/2004 | Cheng et al. |
| 2004/0183855 A1 | 9/2004 | Cheng et al. |
| 2004/0195222 A1 | 10/2004 | Tanaka et al. |
| 2004/0209410 A1 | 10/2004 | Tanaka |
| 2005/0036190 A1* | 2/2005 | Tanaka ............... 359/223 |
| 2005/0037552 A1 | 2/2005 | Yamazaki et al. |
| 2005/0133790 A1 | 6/2005 | Kato |
| 2005/0139582 A1 | 6/2005 | Tanaka |
| 2005/0146006 A1 | 7/2005 | Yamazaki et al. |
| 2007/0153565 A1 | 7/2007 | Nomura et al. |
| 2007/0184639 A1 | 8/2007 | Tanaka et al. |
| 2007/0184670 A1 | 8/2007 | Koyama |

FOREIGN PATENT DOCUMENTS

| | | |
|---|---|---|
| EP | 1357590 A | 10/2003 |
| EP | 1369731 A | 12/2003 |
| EP | 1547719 A | 6/2005 |
| JP | 62-229903 A | 10/1987 |
| JP | 08-276288 A | 10/1996 |
| JP | 2000-275581 A | 10/2000 |
| JP | 2001-105166 A | 4/2001 |
| JP | 2001-273778 A | 10/2001 |
| JP | 2001-345431 A | 12/2001 |
| JP | 2002-196347 A | 7/2002 |
| JP | 2002-228818 | 8/2002 |
| JP | 2002-292487 A | 10/2002 |
| JP | 2004-062156 A | 2/2004 |
| JP | 2004-306127 A | 11/2004 |
| JP | 2005-116682 | 4/2005 |
| JP | 2005-511312 | 4/2005 |
| JP | 2005-203763 A | 7/2005 |
| JP | 2005-210103 A | 8/2005 |
| JP | 2005-268774 A | 9/2005 |
| JP | 2005-275325 A | 10/2005 |
| JP | 2006-032920 A | 2/2006 |
| WO | WO-03/047805 | 6/2003 |
| WO | WO-2005/011014 | 2/2005 |
| WO | WO-2005/081307 | 9/2005 |

OTHER PUBLICATIONS

Written Opinion (Application No. PCT/JP2007/051322) Dated May 1, 2007.

USPTO Office Action (U.S. Appl. No. 11/698,940) dated Dec. 24, 2009.

USPTO Office Action (U.S. Appl. No. 11/698,940) dated Jun. 23, 2010.

* cited by examiner

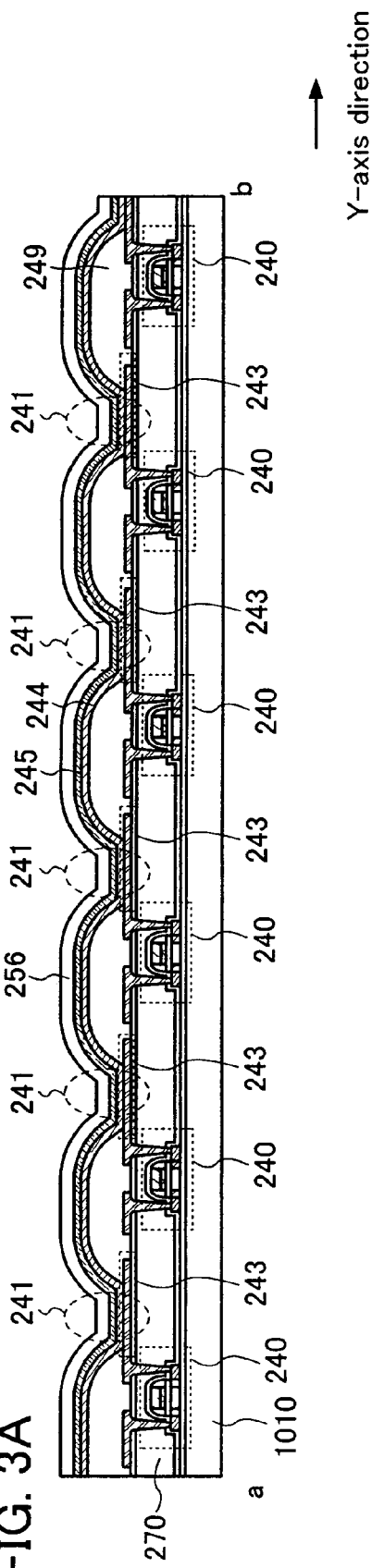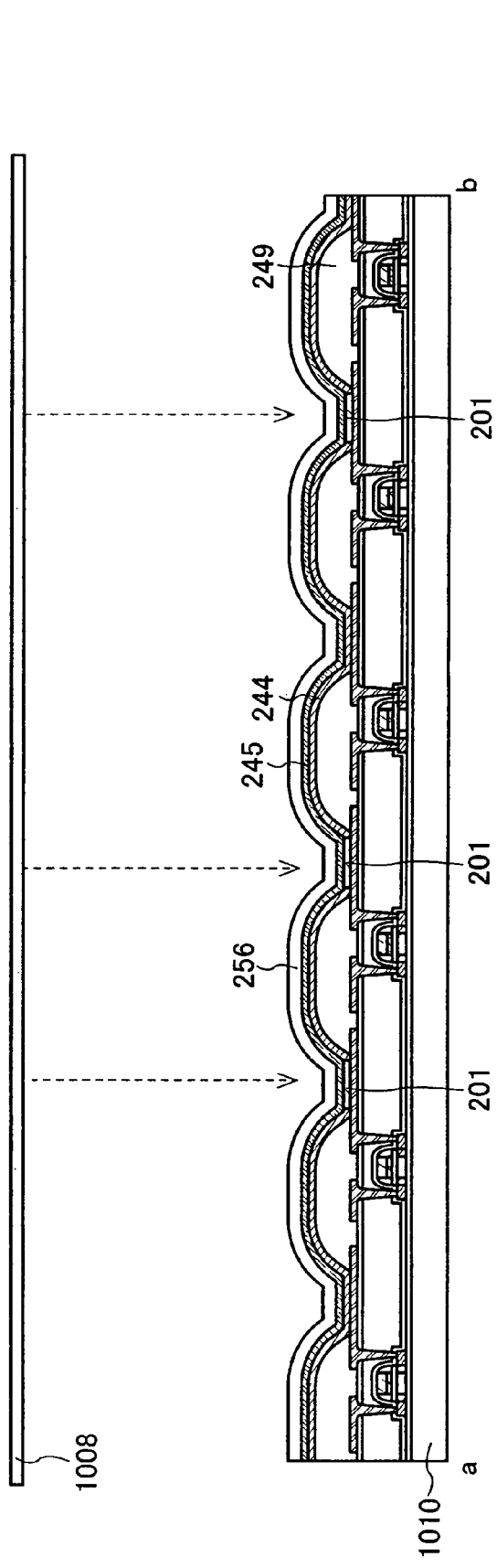

X-axis direction

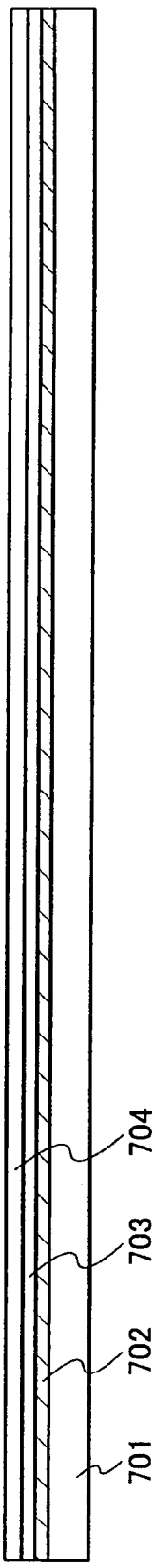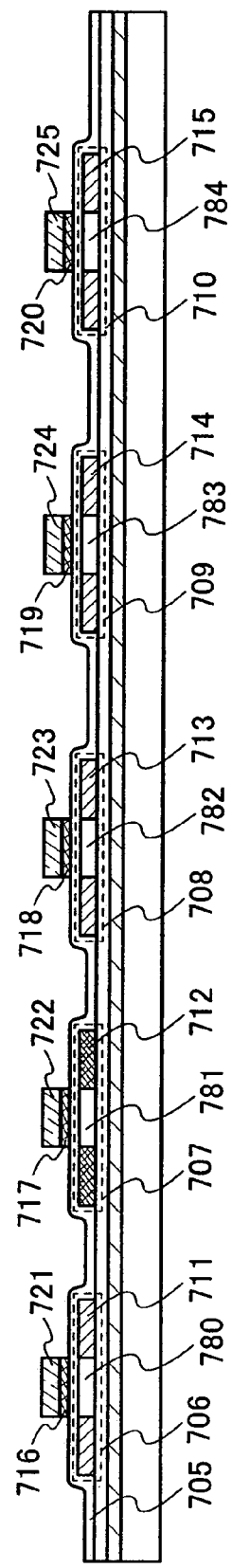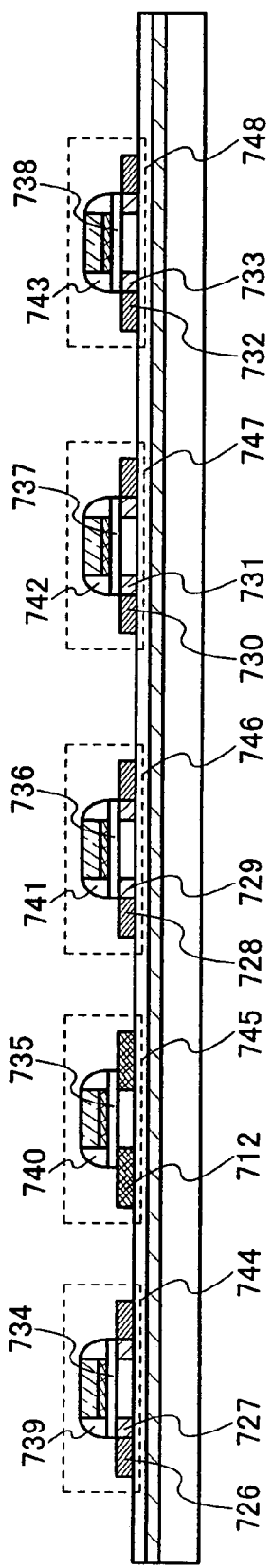

FIG. 19A
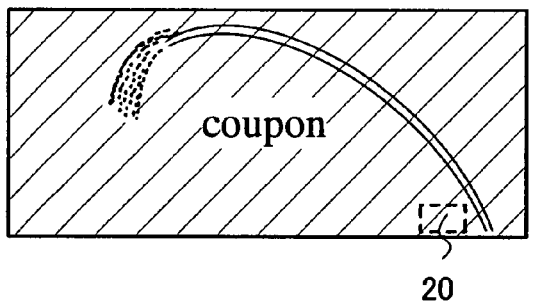
FIG. 19B
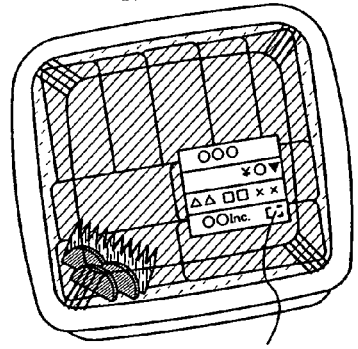
FIG. 19C
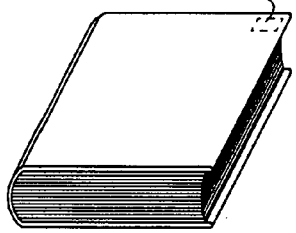
FIG. 19D
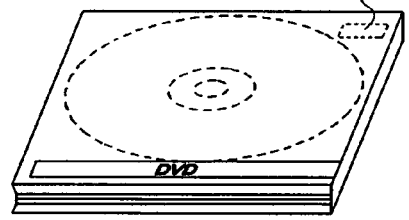
FIG. 19E
FIG. 19F
FIG. 19G
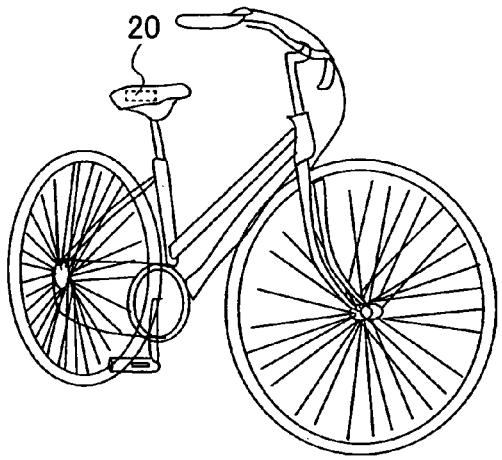
FIG. 19H
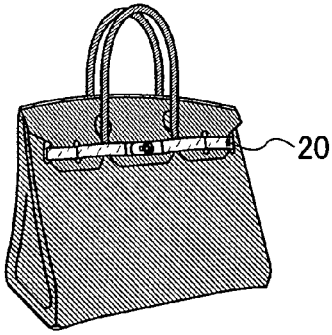

METHOD FOR MANUFACTURING SEMICONDUCTOR DEVICE

BACKGROUND OF THE INVENTION

1. Field of the Invention

The present invention relates to a laser irradiation method for performing laser irradiation efficiently. Further, the present invention relates to a method for manufacturing a semiconductor device, which includes the process of laser irradiation.

2. Description of the Related Art

In recent years, individual recognition technology has attracted attention. For example, there is a technology to be applied to production and management, with which information such as a history of an object is clarified by giving an ID (identification code) to the individual object. Above all, the developments of semiconductor devices that can send and receive data without contact have been advanced. As such semiconductor devices, in particular, an RFID (abbreviation of Radio Frequency Identification) tag (also referred to as an ID tag, an IC tag, and IC chip, an RF (Radio Frequency) tag, a wireless tag, an electronic tag, or a wireless chip) or the like is beginning to be used in businesses, markets, and the like.

Many of semiconductor devices that have already been put to practical use each have a circuit using a semiconductor substrate such as a Si substrate (also referred to as an IC (Integrated Circuit) chip) and an antenna, and the IC chip includes a memory circuit (also referred to as a memory), a control circuit, and the like. A high-value-added semiconductor device providing higher performance can be provided particularly by mounting a memory circuit which stores much data.

Further, such semiconductor devices are required to be manufactured at low cost. Correspondingly, an organic memory element provided with an organic compound layer between a pair of electrodes has been proposed in recent years (for example, Reference 1: Japanese Published Patent Application No. 2005-116682). As a method for writing data into such an organic memory element, methods using electric action or optical action have been proposed. In the case of writing data by electric action, data "0" and data "1" are distinguished from each other based on the difference between the resistances of an area in which a pair of electrodes is short-circuited by applying high voltage therebetween and another area in which the pair of electrodes is not short-circuited, respectively. On the other hand, in the case of writing data by optical action, data "0" and data "1" are distinguished from each other based on the difference between the resistances of an area in which the state of an organic compound layer is changed by irradiating the organic compound layer with a laser beam or the like and another area in which the organic compound layer is not subjected to laser irradiation, respectively.

SUMMARY OF THE INVENTION

However, with respect to a memory circuit including a memory element provided with an organic compound between a pair of electrodes, in the case of writing data by electric action, there is a problem in that an organic compound layer having large film thickness makes it harder for current to flow, which increases drive voltage for writing, depending on the size of the memory circuit. On the other hand, an organic compound layer having small film thickness makes it easier for current to be affected by dust or the shape of irregularities on the electrode layer surface, makes variations occur in characteristics of the memory (writing voltage and the like), and makes normal writing impossible.

Further, in the case of writing data by optical action, only one portion is irradiated by single irradiation when using a conventional laser irradiation method, which takes much time when a plurality of portions is required to be subjected to laser irradiation. For example, when a large quantity of ID chips is produced, an enormous number of positions are required to be subjected to laser irradiation, so that there is a problem in that writing takes much time and thus reducing productivity.

In view of the foregoing problems, the present invention provides a method for manufacturing a semiconductor device using a method in which a desired position is rapidly subjected to laser irradiation while switching laser irradiation patterns.

With respect to an organic memory element having a structure in which an organic compound layer is interposed between a pair of conductive layers, data is written to the organic memory element by laser irradiation using a laser irradiation apparatus. Further, a laser beam emitted from a laser oscillator is split by a diffractive optical element into a plurality of laser beams, thereby irradiating a plurality of portions on the organic compound layer with laser beams by single irradiation.

A method for manufacturing a semiconductor device of the present invention includes the steps of forming a first conductive layer over a substrate; forming an organic compound layer over the first conductive layer; forming a second conductive layer over the organic compound layer; and irradiating the organic compound layer with a laser beam split by a diffractive optical element into a plurality of laser beams from the second conductive layer side.

A method for manufacturing a semiconductor device of the present invention includes the steps of forming a first conductive layer over a substrate provided with a transistor, which is connected to the transistor; forming an organic compound layer over the first conductive layer; forming a second conductive layer over the organic compound layer; and irradiating the organic compound layer with a laser beam split by a diffractive optical element into a plurality of laser beams from the second conductive layer side.

A method for manufacturing a semiconductor device of the present invention includes the steps of forming a first conductive layer over a substrate; forming an organic compound layer over the first conductive layer; forming a second conductive layer over the organic compound layer; introducing a laser beam emitted from a laser oscillator into a deflector; introducing the laser beam transmitted through the deflector into a diffractive optical element thereby splitting the laser beam into a plurality of laser beams; and irradiating the organic compound layer with the laser beam split into a plurality of laser beams from the second conductive layer side.

A method for manufacturing a semiconductor device of the present invention includes the steps of forming a first conductive layer over a substrate provided with a transistor, which is connected to the transistor; forming an organic compound layer over the first conductive layer; forming a second conductive layer over the organic compound layer; introducing a laser beam emitted from a laser oscillator into a deflector; introducing the laser beam transmitted through the deflector into a diffractive optical element thereby splitting the laser beam into a plurality of laser beams; and irradiating the organic compound layer with the laser beam split into a plurality of laser beams from the second conductive layer side.

A method for manufacturing a semiconductor device of the present invention includes the steps of forming a first conductive layer over a substrate; forming an organic compound layer over the first conductive layer; forming a second conductive layer over the organic compound layer; introducing a laser beam emitted from a laser oscillator into a diffractive optical element thereby splitting the laser beam into a plurality of laser beams; introducing the laser beam transmitted through the diffractive optical element into a digital micromirror device having a plurality of micromirrors; and irradiating the organic compound layer with the laser beam split into a plurality of laser beams from the second conductive layer side.

A method for manufacturing a semiconductor device of the present invention includes the steps of forming a first conductive layer over a substrate provided with a transistor, which is connected to the transistor; forming an organic compound layer over the first conductive layer; forming a second conductive layer over the organic compound layer; introducing a laser beam emitted from a laser oscillator into a diffractive optical element thereby splitting the laser beam into a plurality of laser beams; introducing the laser beam transmitted through the diffractive optical element into a digital micromirror device having a plurality of micromirrors; and irradiating the organic compound layer with the laser beam split into a plurality of laser beams from the second conductive layer side.

A method for manufacturing a semiconductor device of the present invention includes the steps of forming a plurality of organic memory elements having a first containing layer, an organic compound layer, and a second conductive layer; introducing a laser beam emitted from a laser oscillator into a diffractive optical element thereby split the laser beam into a plurality of laser beams; and selectively irradiating at least two organic memory elements of the plurality of organic memory elements. Thus, only an organic layer constituting the at least two organic memory elements is irradiated with the plurality of split laser beams.

In a method for manufacturing a semiconductor device of the present invention, the organic compound layer is selectively irradiated with the laser beam split into the plurality of laser beams, thereby the organic compound layer is partially insulated.

In a method for manufacturing a semiconductor device of the present invention, the organic compound layer is formed by spin coating, screen printing, or a droplet discharge method.

In a method for manufacturing a semiconductor device of the present invention, the diffractive optical element is a transmissive diffractive optical element or a reflective diffractive optical element.

The present invention makes it possible to irradiate a plurality of portions with laser beams by single irradiation, improve speed of writing data into a semiconductor device including a memory element having an organic compound layer, and improve the productivity of the semiconductor device. Further, the productivity of an ID chip or the like having the semiconductor device can be improved.

BRIEF DESCRIPTION OF DRAWINGS

In the accompanying drawings:

FIGS. 3A and 3B each show a configuration example of a semiconductor device;

FIGS. 14A to 14C show steps of manufacturing a semiconductor device;

FIGS. 19A to 19H show usage patterns of a semiconductor device of the invention.

DETAILED DESCRIPTION OF THE INVENTION

Embodiment Modes

Figure 1A:
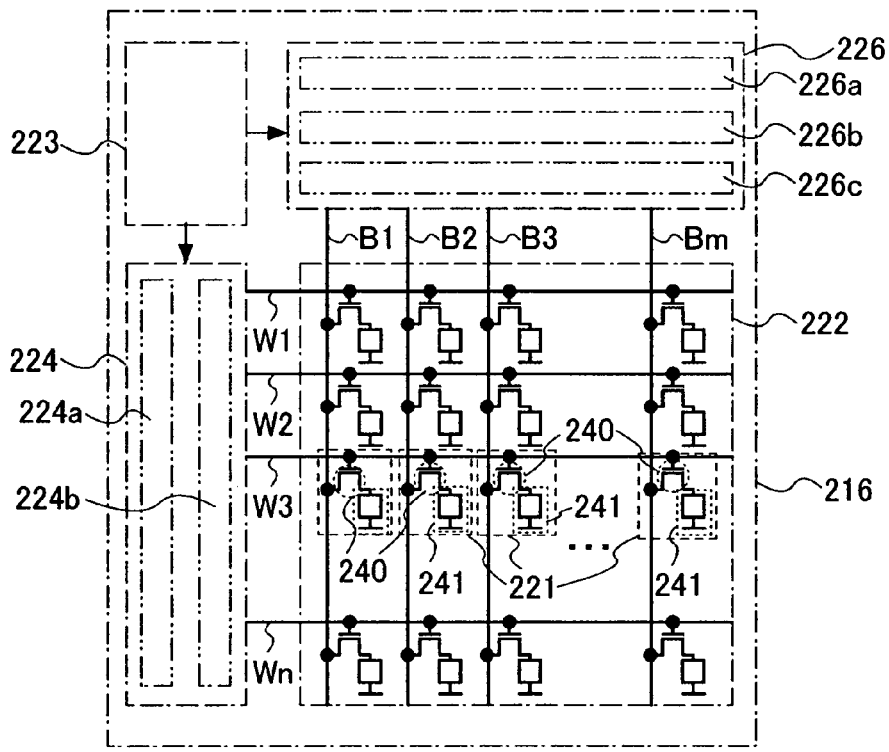
FIGS. 1A and 1B each show a configuration example of a semiconductor device.

Embodiment modes of the present invention will be described with reference to the drawings. Note that the present invention can be implemented in many different forms, and it is easily understood by those skilled in the art that the modes and details can be variously modified without departing from the spirit and scope of the present invention. Therefore, the present invention is not construed as being limited to the description of Embodiment Modes. In all the drawings, the same reference numerals denote the same parts or the parts having similar functions, and the descriptions will not be repeated.

Embodiment Mode 1

In this embodiment mode, a method of writing data into a memory circuit area of a semiconductor device, in which the memory circuit area includes an organic compound, will be explained with reference to FIGS. 1 to 4B.

FIG. 1A is a schematic view of a semiconductor device having a memory circuit including a memory cell array 222 in which a plurality of memory cells 221 are arranged in matrix; a bit line driver circuit 226 including a column decoder 226a, a read circuit 226b, and a selector 226c; a word line driver circuit 224 including a row decoder 224a and a level shifter 224b; and an interface 223 having a writing circuit, which communicates with the external. Note that the structure shown here is only an example; accordingly, the memory circuit 216 may include another circuit such as a sense amplifier, an output circuit, or a buffer; alternatively, the wiring circuit may be provided in the bit line driver circuit.

The plurality of memory cells 221 each include at least a transistor 240 and a memory element (organic memory element) 241. The transistor 240 is connected to a first wiring constituting a word line Wy (1≤y≤n) and a second wiring constituting a bit line Bx (1≤x≤m). Note that organic memory element 241 has a layered structure of the first conductive layer, the organic compound layer, and the second conductive layer.

Figure 1B:
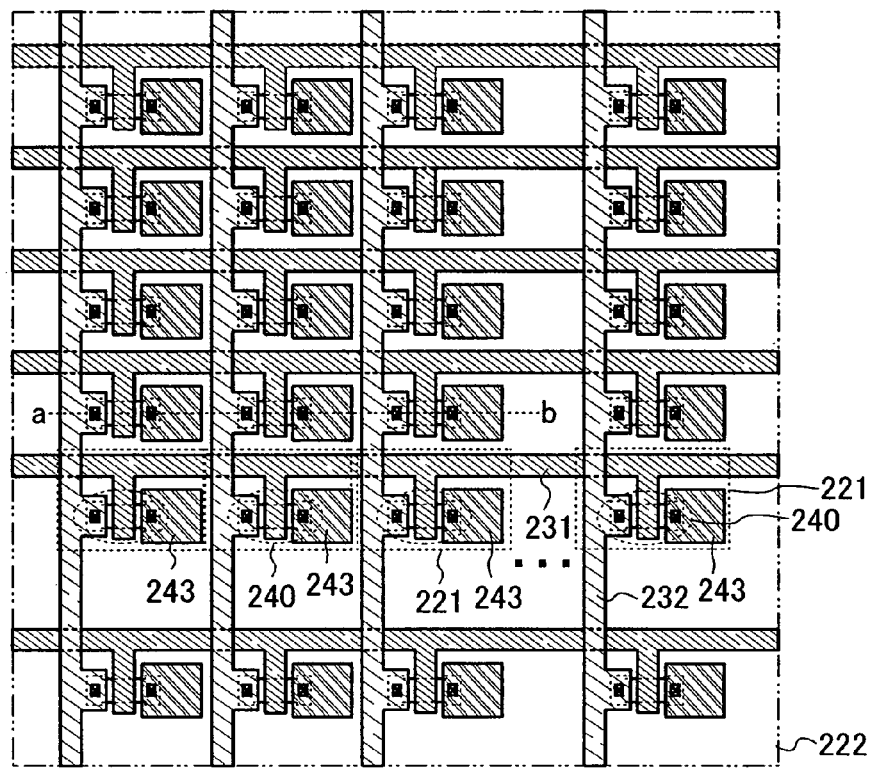

FIG. 1B shows a structure example of the memory cell array 222 viewed from the above. In the memory cell array 222, a first wiring 231 extending in a first direction and a second wiring 232 extending in a second direction different from the first direction (here, in the perpendicular direction) are arranged in matrix. Further, the second wiring 232 is electrically connected to one of the source and drain regions of the transistor 240, and the first wiring 231 is electrically connected to the gate electrode of the transistor 240 here. Furthermore, one of the source region and the drain regions of the transistor 240 which is not connected with the second wiring 232 is connected to a first conductive layer 243. Note that although not shown in FIG. 1B, the plurality of organic memory elements 241 shown in FIG. 1A is provided with a layered structure of the first conductive layer 243, the organic compound layer, and a second conductive layer.

Figure 2:
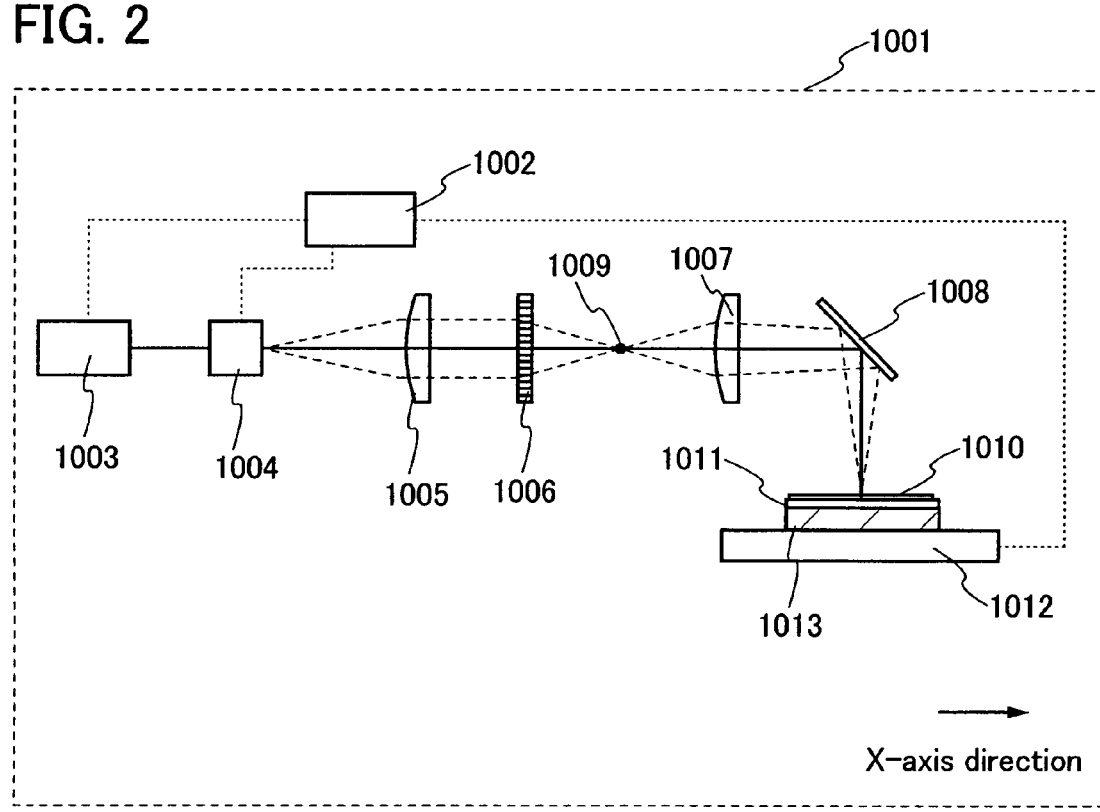
FIG. 2 shows a configuration example of a laser irradiation apparatus.

In this embodiment mode, writing data into the organic memory elements is performed by using a laser irradiation apparatus shown in FIG. 2. In FIG. 2, a laser irradiation apparatus 1001 is provided with a computer which performs various controls in irradiation with a laser beam (hereinafter referred to as PC) 1002, a laser oscillator 1003 which outputs a laser beam, a deflector 1004, a collimating lens 1005, a transmissive diffractive optical element 1006, a projection lens 1007, a mirror 1008, transfer stages 1012 and 1013 including an X-axis stage and a Y-axis stage respectively.

A laser oscillator 1003 which can emit ultraviolet light, visible light, or infrared light can be used as the laser oscillator 1003. An excimer laser oscillator using KrF, ArF, KrCl, XeCl, XeF, or the like; a gas laser oscillator using He—Cd, Ar, He—Ne, or the like; a solid-state laser oscillator using a crystal such as YAG, GdVO$_4$, YVO$_4$, YLF, or YAlO$_3$ doped with Yb, Cr, Nd, Er, Ho, Ce, Co, Ti, or Tm; or a semiconductor laser oscillator using GaN, GaAs, GaAlAs, InGaAsP, or the like can be used as the laser oscillator. Note that a fundamental wave or one of second to fifth harmonics is preferably applied to a solid-state laser oscillator.

First, a laser beam emitted from the laser oscillator 1003 is transmitted through the deflector 1004. This embodiment mode shows an example of using an AOD (acousto-optic deflector) as the deflector. Note that the deflector 1004 is not limited to an AOD, and the direction of travel of the laser beam may be controlled with the use of a galvanometer mirror, for example. An AOD is a device which deflects a laser beam by an acousto-optic effect in an optical medium. Note that the deflection angle at that time is expressed in Equation (1) below.

$$\theta = \lambda f_d / V_a \quad (1)$$

Here, λ represents a wavelength, $f_a$ represents an acoustic frequency, and $V_a$ represents an acoustic wave velocity. Note that the optical medium is selected as appropriate depending on the wavelength, the deflection direction, the laser power, or the like. For example, in a visible region, a material of gallium phosphide, tellurium dioxide, indium phosphide, or the like can be used.

Next, a laser beam deflected by the deflector 1004 at a deflection angle proportional to the acoustic frequency enters the collimating lens 1005. The focal length of the collimating lens 1005 is set at $f_c$, and it is disposed at a distance of $f_c$ from the deflector 1004. Thus, the whole laser beam transmitted through the collimating lens 1005 travels in a direction parallel to the light axis regardless of the deflection angle of the deflector 1004. Note that, here, the collimating lens 1005 is used here to make it easy to design the diffractive optical element by controlling the direction of travel of the laser beam, thereby increasing diffraction efficiency. Therefore, when a diffractive optical element by which a diffraction efficiency and beam characteristics satisfying the conditions of an exposure process can be obtained can be designed, the collimating lens 1005 need not be used.

Subsequently, the laser beam transmitted through the collimating lens 1005 enters the transmissive diffractive optical element 1006. Note that the diffractive optical element used here is for controlling the behavior of the laser beam due to the diffraction phenomenon of its surface structure instead of controlling light by refraction or reflection. The diffractive optical element is designed by optimizing phase distribution using an ORA (Optimal Rotation Angle) method or the like. Further, the diffractive optical element can also be automatically designed with optical design software capable of wave optical analysis. As the diffractive optical element, a binary phase grating, a multilevel phase grating, a continuous phase grating, or the like can be applied. Note that in this embodiment mode, the transmissive diffractive optical element 1006 is designed to have a function of splitting a laser beam.

Further, the diffractive optical element 1006 is designed so that the laser beam split by the diffractive optical element 1006 is wholly converged in a region denoted by 1009 in the drawing. Note that in this embodiment mode, a plurality of beam spots converged in the region 1009 is formed and arranged in a lateral direction on the paper. Further, the laser beam transmitted through the region 1006 enters the projection lens 1007. The projection lens 1007 is provided so as to project a beam spot formed in the region 1009 on the irradiation surface on the substrate 1010. The region 1009 and the irradiation surface are conjugated to each other, when the distance from the region 1009 to the projection lens 1007 is a, the distance from the projection lens 1007 to the irradiation surface is b, and the focal length of the projection lens is f, a conjugate equation, Equation (2) holds.

$$1/f = 1/a + 1/b \quad (2)$$

Note that the projection lens 1007 is provided so that reduction projection or the like is made possible by transferring a point formed in the region 1009 to the irradiation surface, thereby making it possible to process the irradiation surface more finely. Therefore, when a desired beam spot is formed in the region 1009, the projection lens 1007 need not be provided. Further, here, the diffractive optical element 1006 has a converging function; however, the laser beam remaining as collimated light may be split, and converged on the substrate 1010 which is the irradiation surface by using the projection lens 1007 as a converging lens.

Next, the laser beam transmitted through the projection lens 1007 is deflected by the mirror 1008, so that the direction of travel is changed to the direction of the irradiation surface on the substrate 1010. Note that a conductive layer, an organic compound layer, an insulating layer, and the like are stacked over the substrate 1010, and the substrate 1010 is irradiated with a laser beam transmitted through the optical system. A pattern of the laser beam used here is formed in accordance with a pattern of each diffractive optical element constituting the diffractive optical element 1006.

Here, FIGS. 3A and 3B show schematic diagrams of a cross section of the substrate 1010 viewed from a direction parallel to the paper of FIG. 2. Note that FIGS. 3A and 3B are cross-sectional views of the substrate 1010 taken along broken line a-b on the memory cell array 222 shown in FIG. 1B. In this embodiment mode, the transistor 240 functioning as a switching element of a memory element portion, an interlayer insulating film 270, a first conductive layer 243 functioning as a source electrode or a drain electrode of the transistor 240, a first insulating layer 249, an organic compound layer 244, a second conductive layer 245, and a second insulating layer 256 are provided over the substrate 1010. Further, a region including the first conductive layer 243, the organic compound layer 244, and the second conductive layer 245 corresponds to the organic memory element 241. In this embodiment mode, a mode in which five organic memory elements 241 are formed will be described; however, the number of the organic memory elements 241 can be set arbitrarily.

Next, the laser beam deflected by the mirror 1008 irradiates the organic compound layer 244 from a light-transmitting conductive layer (here, the second conductive layer 245) side (FIG. 3B). Here, a plurality of portions of the organic compound layer 244 included in desired part of the organic memory elements 241 is selectively irradiated with laser beams by using a laser irradiation apparatus thereby partially (selectively) changing the state of the organic compound layer 244. In other words, at least two organic memory elements of the plurality of organic memory elements 241 are selected to be irradiated with laser beams, and only organic compound layers forming the selected organic memory elements are irradiated with laser beams. The areas in the organic compound layers, which are irradiated with the laser beams, are carbonized and insulated. Therefore, when an organic memory element having a destroyed organic compound layers and an organic memory element having an undestroyed organic compound layers are compared, electrical resistance between the first conductive layer and the second conductive layer in the former organic memory element is significantly higher. Note that in FIG. 3B, the carbonized and insulated organic compound layers are shown as regions 201. Thus, data are written using a phenomenon in which electrical resistance between two conductive layers provided so that the organic compound layer 244 is interposed therebetween changes due to laser beam irradiation. For example, in the case where an organic memory element including an organic compound layer which is not irradiated with a laser beam is data "0", desired part of an organic compound layer is selectively irradiated with a laser beam and destroyed to increase the electric resistance in the case of writing data "1". Note that in this embodiment mode, a structure in which the organic compound layer 244 is irradiated with laser beams from the second conductive layer 245 side; however, a structure in which the organic compound layer 244 is irradiated with laser beams from the first conductive layer 243 side may be used instead. In that case, the substrate 1010, the conductive layer 243, and the like have light-transmitting properties; and the organic compound layer 244 is selectively irradiated with laser beams from the substrate 1010 side thereby the organic compound layer 244 is partially insulated. Further, the organic compound layer 244 may be irradiated with laser beams before the second conductive layer 245 is formed.

In the case of irradiation with a laser beam, the change of electric resistance of an organic memory element depends on the size of the memory cells 221; however, the change is realized by irradiation with a laser beam converged to a beam spot having a diameter of about several micrometer. For example, when a laser beam having a diameter of 1 μm passes at a velocity of 10 m/sec, the period of irradiating the organic memory element included in one memory cell 221 with laser light is 100 nsec. In order to change the phase of an organic compound layer within time as short as 100 nsec, the laser power is preferably 10 mW and the power density is preferably 10 kW/mm², for example.

Note that substrate 1010 is attached to the suction stage 1011, and the suction stage 1011 is transferred by the transfer stage 1012 in the X-axis direction in FIG. 2. Further, instead of using a suction stage, the substrate may be pressed against and attached to a stage by simply using a fixture in order to secure a substrate to a stage. The transfer rate at that time may be determined suitably depending on the spacing between the desired laser irradiation patterns. For example, in the case of performing laser irradiation at a spacing of $D_x$ (μm) in the X-axis direction, when the repetition rate of a pulsed laser oscillator is H (Hz), a transfer rate $V_x$ (m/sec) of the transfer stage 1012 can be determined by Equation (3) below.

$$V_x = D_x \times H \times 10^{-6} \qquad (3)$$

For example, in the case of performing laser irradiation using a laser of a repetition rate of 1 kHz at a spacing of 100 μm in the X-axis direction, the transfer rate may be 10 cm/sec. After scanning in the X-axis direction, the substrate is moved in the Y-axis direction with the transfer stage 1013. After finishing movement in the Y-axis direction to a desired position, laser irradiation is performed while the transfer stage 1012 is moved in the X-axis direction again.

Note that when a pulsed laser is used for the laser oscillator 1003 and laser irradiation is performed by changing the deflection angle of the deflector 1004 for every pulse, the oscillation spacing of the laser oscillator 1003 is required to be perfectly synchronized with the deflection period of the deflector 1004. Further, in order to perform laser irradiation at a precisely determined position in the substrate surface, the movement of the stage 1012 or 1013 is required to be interlocked with the movements of the laser oscillator 1003 and the deflector 1004. In that case, the movements may be controlled with the computer 1002. Specifically, an encoder for which can check the position is attached to the stage 1012 or 1013, thereby holding positional information from the encoder in the computer 1002. In addition, at a time when the transfer stage reaches a desired position, an operation signal is outputted to the laser oscillator 1003. The laser oscillator 1003 is provided with an interior shutter. The shutter opens on receiving the operation signal and then the laser irradiation is started. Further, irradiation patterns of the irradiation units arranged in the X-axis direction are read in advance by the computer 1002 from the memory storing the laser irradiation patterns in the substrate surface. After moving the transfer stage 1012 in the X-axis direction, on oscillating the laser oscillator 1003, the deflection angle of the deflector 1004 is sequentially controlled in accordance with the read patterns. Note that in order to synchronize movements of the laser oscillator 1003 and the deflector 1004, a trigger signal generated from the laser oscillator 1003 in a laser oscillation period is monitored, and the deflector 1004 may be operated in accordance with the signal. Alternatively, a laser beam emitted from the laser oscillator 1003 is partially monitored with a photoelectric element or the like, and the deflector 1004 may be operated in synchronization with an electric signal generated by this. Note that an example of irradiating an irradiation pattern of one portion with one laser pulse has been described; however, the configuration of a laser irradiation apparatus of the invention is not limited thereto. For example, in the case of irradiating a material having poor photosensitivity, or the like, a configuration in which irradiation is performed with a plurality of overlapped laser pulses for one laser irradiation pattern may be used. Using the laser irradiation apparatus shown in FIG. 2, a plurality of portions on the organic semiconductor layer can be irradiated with laser beams by single irradiation. Note that the configuration of the laser irradiation apparatus is not limited to that shown in FIG. 2, and any configuration which makes it possible to split a laser beam emitted from the laser oscillator 1003 into a plurality of laser beams on the irradiated surface may be used.

Figure 4A:
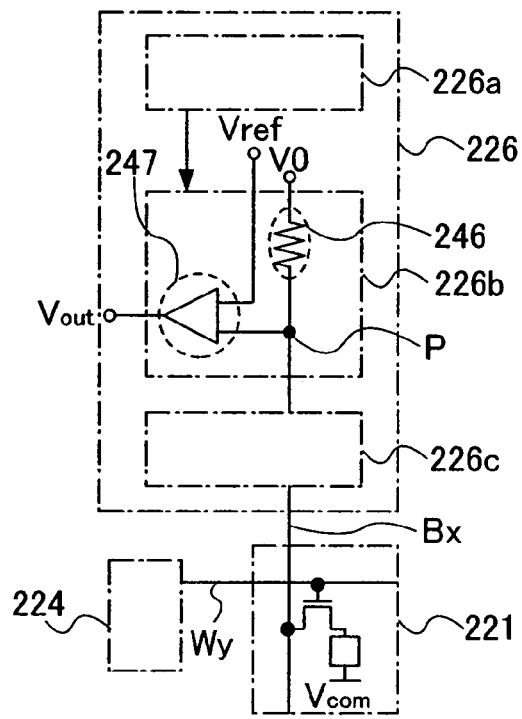
FIGS. 4A and 4B each show a configuration example of a semiconductor device.
Figure 4B:
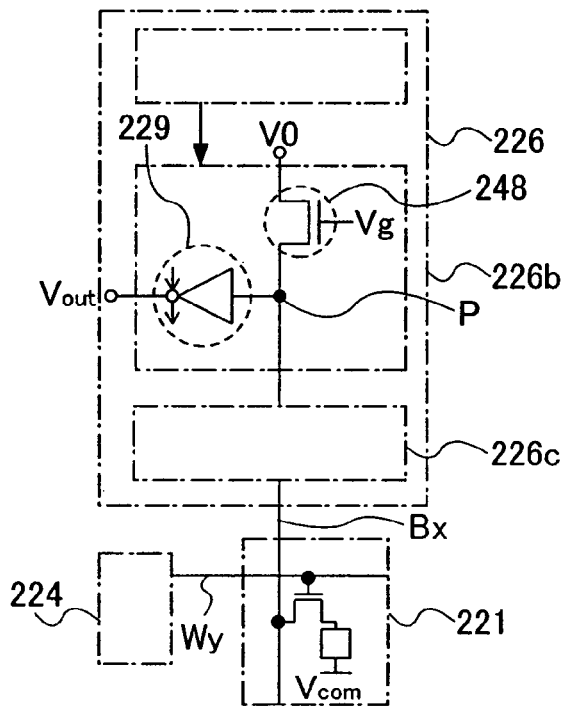

Next, operation of reading data will be explained. In this embodiment mode, reading of data is carried out by electric action using electronic characteristics of the organic memory element 241, which are different between a memory cell with data "0" and a memory cell with data "1". For example, a reading method by utilizing the difference in electric resistance will be explained, provided that electric resistance of the memory element included in the memory cell with data "0" is R0 at a reading voltage, and electric resistance of the memory element included in the memory cell with data "1" is R1 at a reading voltage (R1<<R0). As for a read circuit 226b, for example, a bit line driver circuit 226 using a resistor 246 and a differential amplifier 247 shown in FIG. 4A is conceivable as a structure of its reading portion. The resistor has a resistance value of Rr (R1<Rr<R0). A transistor 248 may be used instead of the resistor 246 and a clocked inverter 249 can be used instead of the differential amplifier (FIG. 4B). Naturally, a circuit configuration is not limited to FIGS. 4A and 4B.

In the case of reading data from the memory cell 221 in the Y-th row and X-th column, the memory cell 221 is selected first by the row decoder 224a, the column decoder 226a, and the selector 226c through the interface 223. Concretely, a predetermined voltage V24 is applied to a word line Wy connected to the memory cell 221 by the row decoder 224a. A bit line Bx connected to the memory cell 221 is connected to a terminal P of the read circuit 226b by the column decoder 226a and the selector 226c. Accordingly, the electric potential Vp of the terminal P is a value determined by dividing Vcom and V0 applied to an end of the resistor by the resistor 246 (resistance value: Rr) and the organic memory element 241 (resistance value: R0 or R1). Therefore, the equation Vp0=Vcom+(V0−Vcom)×R0/(R0+Rr) holds in the case where the memory cell 221 has data "0". Alternatively, the equation Vp1=Vcom+(V0−Vcom)×R1/(R1+Rr) holds in the case where the memory cell 221 has data "1". As a result, by selecting Vref so as to be between Vp0 and Vp1 in FIG. 4A or by selecting the change point of the clocked inverter so as to be between Vp0 and Vp1 in FIG. 4B, the output electric potential of Vout becomes Lo/Hi (or Hi/Lo) in accordance with data "0"/"1", so that reading can be conducted.

For example, the differential amplifier is operated at Vdd=3 V, and Vcom, V0, and Vref are 0 V, 3 V, and 1.5 V, respectively. On the condition that the equation R0/Rr=Rr/R1=9 holds, voltage of Hi is outputted as Vout at Vp0=2.7 V when a memory cell has data "0", or voltage of Lo is outputted as Vout at Vp1=0.3 V when a memory cell has data "1". In this way, reading from a memory cell can be conducted.

In accordance with the above method, reading is conducted by a voltage value utilizing the difference in a resistance value of the organic memory element and resistance division. Naturally, the reading method is not limited thereto. For example, reading may be conducted by utilizing the difference in current values other than the method utilizing the difference in electric resistances. In the case where electric characteristics of the memory cell have different diode characteristics in threshold voltages in the case of data "0" and data "1", reading may be carried out by using difference in the threshold voltages.

An organic memory or a semiconductor device equipped with the organic memory which has the above structure is a nonvolatile memory; therefore, a power source for storing data is not required to be incorporated. Accordingly, a small-sized, thin, and lightweight semiconductor device can be provided. Further, using an organic compound material for the organic compound layer, a memory element in which data cannot be rewritten though data can be written (additionally) can be obtained. Accordingly, counterfeits can be prevented, and a semiconductor device with ensured security can be provided.

In this embodiment mode, description has given using an active matrix organic memory and a semiconductor device equipped with the organic memory as examples. However, even in the case of using a passive matrix memory circuit, data can be written or read in a similar manner.

In this embodiment mode, a plurality of portions on the organic compound layer can be irradiated with laser beams by single irradiation. Therefore, speed of writing data into a semiconductor device including a memory element having an organic compound layer can be improved and the productivity of the semiconductor device can be improved. Further, when the semiconductor device is use for an ID chip or the like for example, productivity of the ID chip or the like can be improved, and the ID chip or the like can be mass-produced at low cost.

Embodiment Mode 2

In this embodiment mode, a configuration of a laser irradiation apparatus having a different configuration from the laser irradiation apparatus for irradiating an organic compound layer with laser beams, which is shown in FIG. 2 will be described. A configuration of the apparatus and a method of laser irradiation using a reflective diffractive optical element as a diffractive optical element will be described with reference to FIG. 5.

Figure 5:
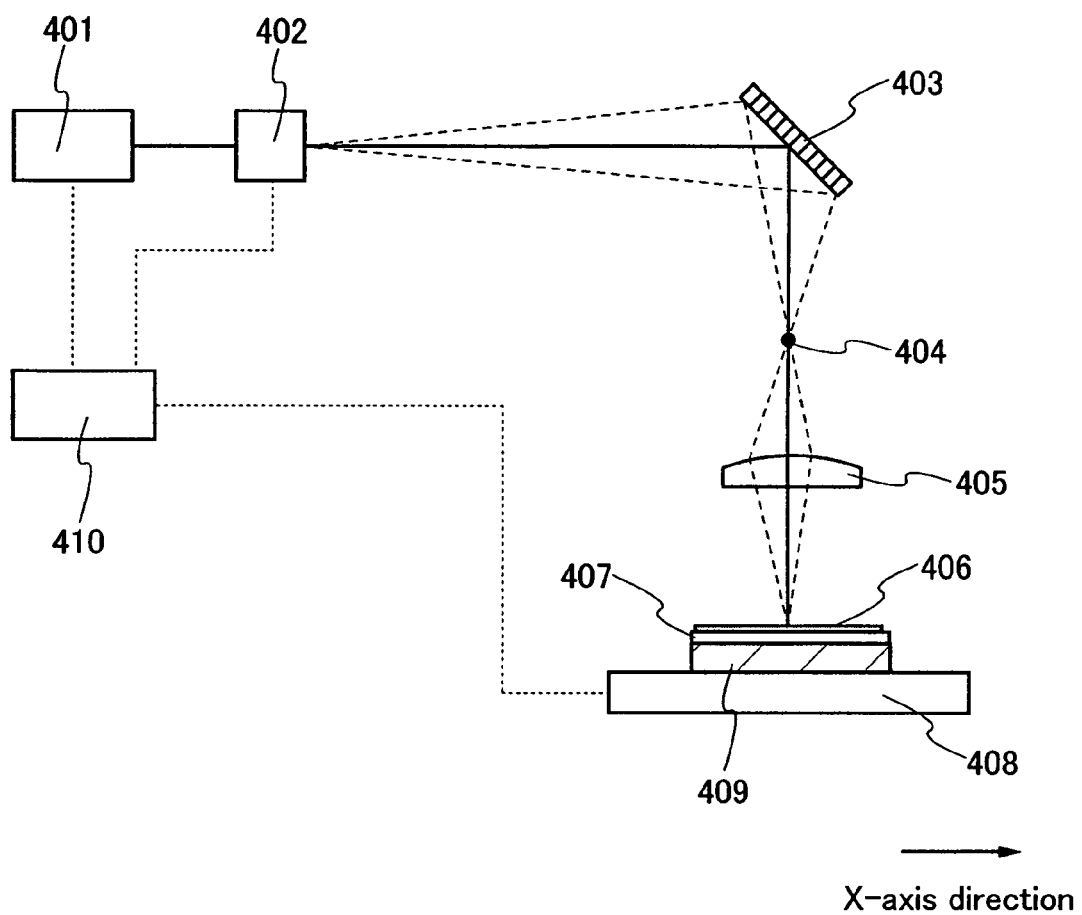
FIG. 5 shows a configuration example of a laser irradiation apparatus.

FIG. 5 is a schematic diagram of a laser irradiation apparatus of this embodiment mode. A laser beam emitted from a laser oscillator 401 passes through a deflector. In this embodiment mode, an example of using an acousto-optic deflector (AOD) 402 as the deflector will be described. Note that the deflector used in the present invention is not limited to an AOD. For example, the direction of travel of a laser beam may be controlled by using a galvanometer mirror. An AOD is a device which deflects a laser beam by an acousto-optic effect in an optical medium. A laser beam deflected at a deflection angle proportional to the acoustic frequency applied to the AOD enters a reflective diffractive optical element 403. Note that the diffractive optical element 403 is designed to deflect the laser beam in the substrate direction and to split the laser beam. The laser beam deflected by the AOD 402 is made to enter one of diffractive optical elements which forms each pattern. Further, the laser irradiation apparatus is designed, whereby the laser beam split by the reflective diffractive optical element 403 is wholly converged to a region 404 in the drawing. Note that in this embodiment mode, a plurality of beam spots gathered in the region 404 are formed and arranged in the longitudinal direction of the paper. Further, the laser beam transmitted through the region 404 enters a projection lens 405. The projection lens 405 is provided so that the beam spot formed in the region 404 is projected on an irradiation surface. The region 404 and the irradiation surface are conjugated to each other, and when the distance from the region 404 to the projection lens 405 is a, the distance from the projection lens 405 to the irradiation surface is b, and the focal length of the projection lens 405 is f, a conjugate equation, Equation (4) holds.

$$1/f = 1/a + 1/b \qquad (4)$$

Note that the projection lens 405 is provided so that reduction projection or the like is made possible by transferring a point formed in the region 404 to the irradiation surface, thereby making it possible to process the irradiation surface more finely. Therefore, when a desired beam spot is formed in the region 404, the projection lens 405 need not be provided. Further, the diffractive optical element 403 has a converging function in this example; however, instead of providing the function to the diffractive optical element 403, the laser beam may be converged to the substrate 406 by using projection lens 405 as a converging lens. The laser beam transmitted through the projection lens 405 is directed to the substrate 406 which is the irradiation surface. A semiconductor film, a conductive film, a resist layer, and the like are stacked on the substrate 406, and is irradiated with a laser beam by the optical system. A pattern of the laser beam used here is formed in accordance with a pattern of each diffractive optical element constituting the diffractive optical element 403. The substrate 406 is attached to a suction stage 407, and the suction stage 407 is transferred by a transfer stage 408 along the X-axis in the drawing. Further, instead of using a suction stage, the substrate may be pressed against and attached to a stage by simply using a fixture in order to secure a substrate to a stage. The transfer rate at that time may be determined suitably depending on the spacing between the desired laser irradiation patterns. For example, in the case of performing laser irradiation at a spacing of $D_x$ (μm) in the X-axis direction, when the repetition rate of a pulsed laser oscillator is H (Hz), a transfer rate $V_x$ (m/sec) of the transfer stage 408 can be determined by Equation (5) below.

$$V_x = D_x \times H \times 10^{-6} \tag{5}$$

For example, in the case of performing laser irradiation using a laser of a repetition rate of 1 kHz at a spacing of 100 μm in the X-axis direction, the transfer rate may be 10 cm/sec. After scanning in the X-axis direction, the substrate is moved in the Y-axis direction with a transfer stage 409. After finishing movement in the Y-axis direction to a desired position, laser irradiation is performed while the transfer stage 408 is moved in the X-axis direction again.

Note that when a pulsed laser is used for the laser oscillator 401 and laser irradiation is performed by changing the deflection angle of the AOD 402 for every pulse, the oscillation spacing of the laser oscillator 401 is required to be perfectly synchronized with the deflection period of the AOD 402. Further, in order to perform laser irradiation at a precisely determined position in the substrate surface, the movement of the stage 408 or 409 is required to be interlocked with the movements of the laser oscillator 401 and the AOD 402. In that case, the movements may be controlled with the computer 410. Specifically, an encoder for which can check the position is attached to the stage 408 or 409, thereby holding positional information from the encoder in the computer 410. In addition, at a time when the transfer stage reaches a desired position, an operation signal is outputted to the laser oscillator 401. The laser oscillator 401 is provided with an interior shutter. The shutter opens on receiving the operation signal and then the laser irradiation is started. Further, irradiation patterns of the irradiation units arranged in the X-axis direction are read in advance by the computer 410 from the memory storing the laser irradiation patterns in the substrate surface. After moving the transfer stage 408 in the X-axis direction, on oscillating the laser oscillator 401, the deflection angle of the AOD 402 is sequentially controlled in accordance with the read patterns. Note that in order to synchronize movements of the laser oscillator 401 and the AOD 402, a trigger signal generated from the laser oscillator 401 in a laser oscillation period is monitored, and the AOD 402 may be operated in accordance with the signal. Alternatively, a laser beam emitted from the laser oscillator 401 is partially monitored with a photoelectric element or the like, and the AOD 402 may be operated in synchronization with an electric signal generated by this. Note that an example of irradiating an irradiation pattern of one portion with one laser pulse has been described; however, the configuration of a laser irradiation apparatus of the invention is not limited thereto. A structure with which irradiation is performed by overlapping a plurality of laser pulses for one laser irradiation pattern may be used to perform optimum irradiation for each organic compound material.

The laser irradiation apparatus described in this embodiment mode makes it possible to irradiate a plurality of portions on the organic compound layer with laser beams by single irradiation. Therefore, speed of writing data into a semiconductor device including a memory element having an organic compound layer can be improved and the productivity of the semiconductor device can be improved. Further, when the semiconductor device is used for an ID chip or the like for example, productivity of the ID chip or the like can be improved, and the ID chip or the like can be mass-produced at low cost.

Embodiment Mode 3

In this embodiment mode, a configuration of a laser irradiation apparatus having a different configuration from the laser irradiation apparatuses, which are shown in FIGS. 2 and 5 will be described. In this embodiment mode, a configuration of the apparatus in which a plurality of optical systems capable of forming various irradiation patterns are disposed, with which a plurality of irradiation points can be efficiently irradiated with laser beams, and a method of laser irradiation will be described.

Figure 6:
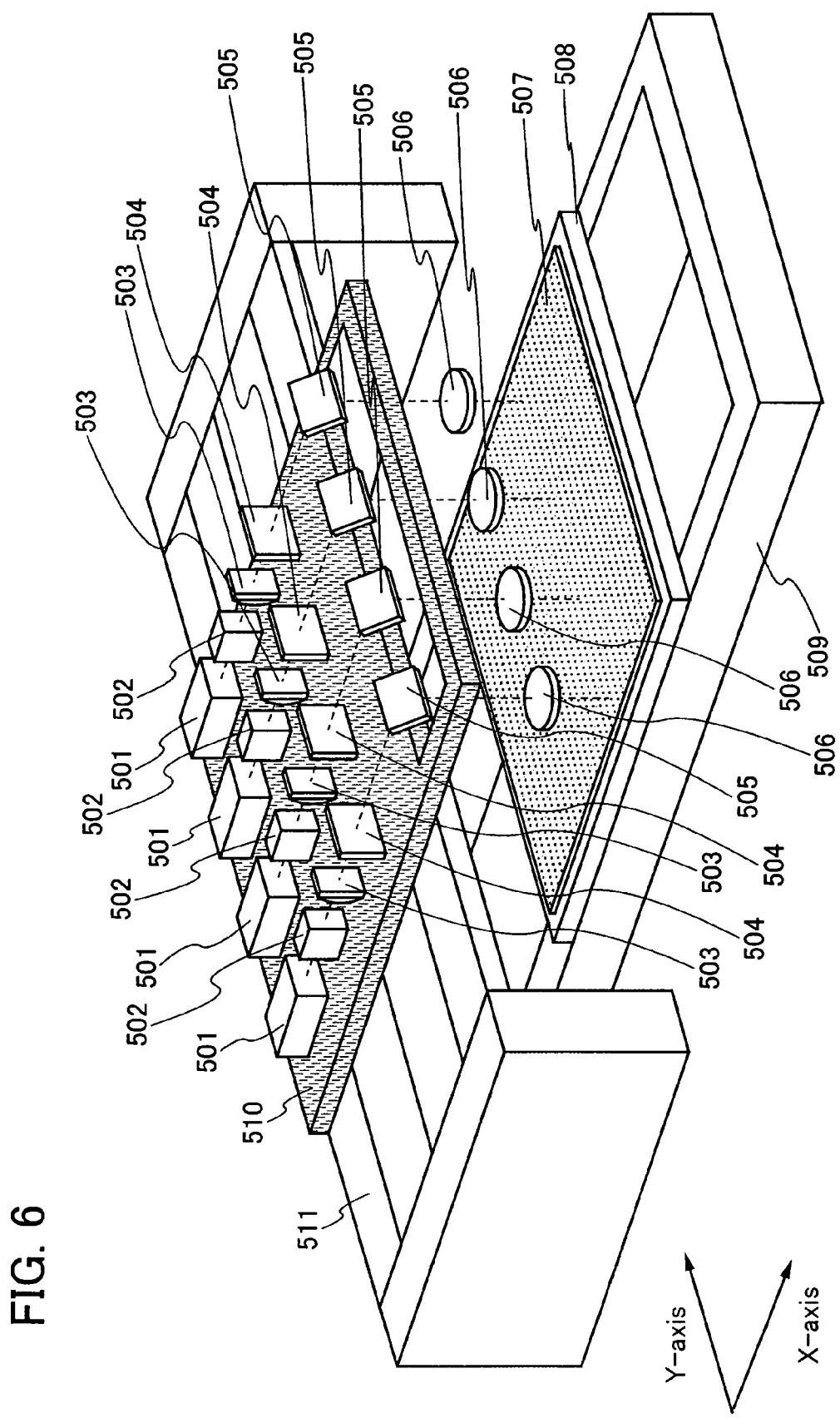
FIG. 6 shows a configuration example of a laser irradiation apparatus.

FIG. 6 is a perspective view showing the laser irradiation apparatus of this embodiment mode. The laser irradiation apparatus shown in FIG. 6 is equipped with a four units of optical systems over an element mount 510. In this embodiment mode, a unit of optical system includes a laser oscillator 501, a deflector 502, a collimating lens 503, a diffractive optical element 504, a mirror 505, and a projection lens 506. A laser beam emitted from the laser oscillator 501 passes through a deflector. In this embodiment, an example of using an AOD (acousto-optic deflector) 502 is used as the deflector will be described. Note that the deflector used in the present invention is not limited to an AOD. For example, the direction of travel of a laser beam may be controlled by using a galvanometer mirror. An AOD is a device which deflects a laser beam by an acousto-optic effect in an optical medium.

Next, the laser beam deflected at a deflection angle proportional to the acoustic frequency applied to the AOD enters a collimating lens 503. The focal length of the collimating lens 503 is set at $f_c$, and it is disposed at a distance of $f_c$ from the AOD 502. Thus, the whole laser beam transmitted through the collimating lens 503 travels in a direction parallel to the light axis regardless of the deflection angle of the AOD. Note that, here, the collimating lens 503 is used here to make it easy to design the diffractive optical element by controlling the direction of travel of the laser beam, thereby increasing diffraction efficiency. Therefore, when a diffractive optical element by which a diffraction efficiency and beam characteristics satisfying the conditions of an exposure process can be obtained can be designed, the collimating lens 503 need not be used.

Next, the laser beam enters the transmissive diffractive optical element 504. The diffractive optical element 504 is designed to split a laser beam. Here, the laser beam deflected by the AOD 502 is made to enter one of diffractive optical elements which forms each pattern. Four laser beams emitted from the four laser oscillators 501 enter one of the four diffractive optical elements 504. Further, each laser beam is split into a plurality of laser beams by being transmitted through the diffractive optical element 504. In other words, laser beams emitted from the plurality of laser oscillators each enters the plurality of different deflectors, and the laser beams transmitted through the deflectors each enter the plurality of different diffractive optical elements; thus, the laser beam is split into a plurality of laser beams by being transmitted through the diffractive optical element.

Further, the laser beam split by the diffractive optical element is deflected in the direction of an irradiation surface by a mirror 505. The laser beam deflected by the mirror 505 is transmitted through a projection lens 506. The projection lens is used for projecting a beam spot which is formed by the diffractive optical element on a substrate 507 which is the irradiation surface. When the projection is reduction projection, the irradiation surface can be processed finely. Note that the optical element is disposed on the element mount 510. Further, a plurality of optical systems having the same structure as the above described one are arranged on the element mount 510. FIG. 6 shows an example of providing four optical systems having the same structure; however, the structure of the optical systems is not limited thereto.

Using the laser irradiation apparatus shown in FIG. 6 a plurality of the laser beams emitted from the four laser oscillators can irradiate one substrate at the same time; thus, throughput of a laser irradiation process can be improved. Note that the number of optical systems provided in the laser irradiation apparatus is not limited to four. The number may be determined as appropriate in consideration of the sizes of components constituting the optical system, desired productivity, or the like.

A conductive film, an organic compound layer, an insulating layer, and the like are stacked on the substrate 507, and is irradiated with a laser beam by the optical system. A pattern of the laser beam used here is formed in accordance with a pattern of each diffractive optical element constituting the diffractive optical element 504. The substrate 507 is attached to a suction stage 508, and the suction stage 508 is transferred by a transfer stage 509 along the X-axis in the drawing. Further, instead of using a suction stage, the substrate may be pressed against and attached to a stage by simply using a fixture in order to secure a substrate to a stage. The transfer rate at that time may be determined suitably depending on the spacing between the desired laser irradiation patterns. For example, in the case of performing laser irradiation at a spacing of $D_x$ (μm) in the X-axis direction, when the repetition rate of a pulsed laser oscillator is H (Hz), a transfer rate $V_x$ (m/sec) of the transfer stage 509 can be determined by Equation (6) below.

$$Vx = Dx \times H \times 10^{-6} \quad (6)$$

For example, in the case of performing laser irradiation using a laser of a repetition rate of 1 kHz at a spacing of 100 μm in the X-axis direction, the transfer rate may be 10 cm/sec. After scanning in the X-axis direction, a transfer stage 511 carrying the element mount 510 is moved in the Y-axis direction. After finishing movement in the Y-axis direction to a desired position, laser irradiation is performed while the transfer stage 509 is moved in the X-axis direction again.

The laser irradiation apparatus described in this embodiment mode makes it possible to irradiate a plurality of portions on the organic compound layer with laser beams by single irradiation. Therefore, speed of writing data into a semiconductor device including a memory element having an organic compound layer can be improved and the productivity of the semiconductor device can be improved. Further, when the semiconductor device is use for an ID chip or the like for example, productivity of the ID chip or the like can be improved, and the ID chip or the like can be mass-produced at low cost.

Embodiment Mode 4

Figure 7:
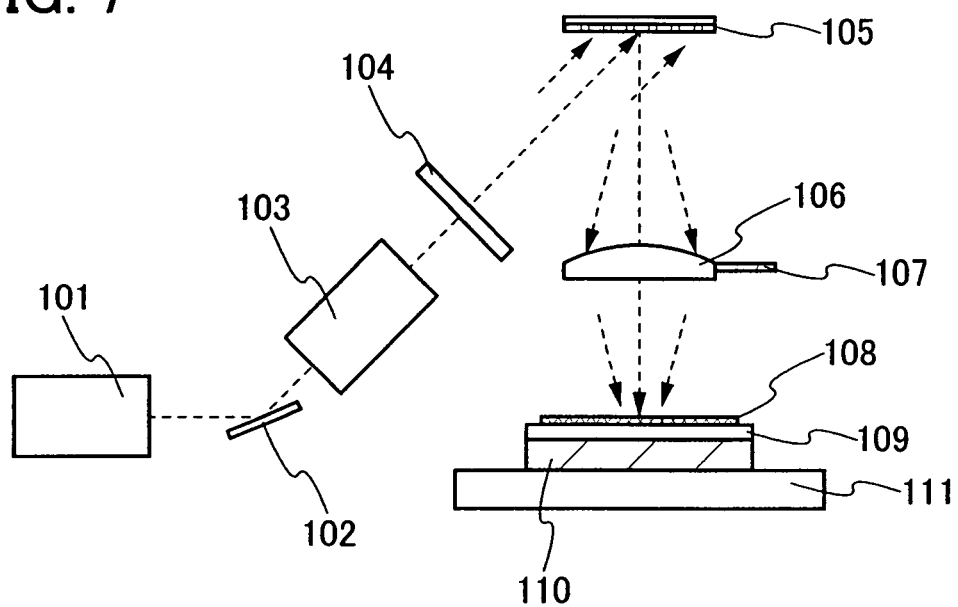
FIG. 7 shows a configuration example of a laser irradiation apparatus.

In this embodiment mode, a laser irradiation apparatus having a different configuration from ones shown in FIG. 2 and FIGS. 5 and 6 will be described. With reference to FIG. 7, an example of splitting a laser beam using a transmissive diffractive optical element into a plurality of laser beams and introducing the laser beam into a digital micromirror device (hereinafter referred to as a DMD), thereby selectively irradiating a substrate surface with a laser beam will be described. Note that a DMD is a kind of optical modulators, in which minute micromirrors are arranged two-dimensionally.

In FIG. 7, the broken line arrow indicates the direction of travel of a laser beam. Here, a laser beam emitted from a laser oscillator 101 is deflected by a mirror 102 and enters an expander 103. The expander 103 has a function of magnifying a beam diameter of a laser beam, for example by arranging two projection lenses. A laser beam transmitted through the expander 103 enters a diffractive optical element 104. Note that here, the expander 103 is used to alleviate design constrains on interval between cuts of the diffractive optical element 104 or the like. Accordingly, when the beam diameter of the laser beam emitted from the laser oscillator is large enough, the expander 103 need not be used. The diffractive optical element 104 is used to split a laser beam to form a plurality of beam spots. Note that an example of using a transmissive diffractive optical element as the diffractive optical element 104 is described here; however, the laser irradiation apparatus of the invention is not limited to the configuration. For example, a reflective diffractive optical element may be disposed inside the optical system.

The diffractive optical element 104 is designed so that the plurality of beam spots of the split laser beams each have the same beam parameter. Thus, for example, even when a beam having Gaussian-like energy distribution is used, a plurality of beam spots having the same energy can be formed by using a diffractive optical element. Note that the diffractive optical element used here is for controlling the behavior of the laser beam due to the diffraction phenomenon of its surface structure. The diffractive optical element is designed by optimizing phase distribution using an ORA (Optimal Rotation Angle) method or the like. Further, the diffractive optical element can also be automatically designed with optical design software capable of wave optical analysis. As the diffractive optical element, a binary phase grating, a multi-level phase grating, a continuous phase grating, or the like can be applied.

Next, the laser beams split by the diffractive optical element 104 is converged to a DMD 105. The number of micromirrors constituting the DMD is equal to the number of the laser beams split by the diffractive optical element, and each laser beam is converged on the micromirror surface. In general, there are gaps between a plurality of micromirrors constituting a DMD, laser beams entering the gaps between the micromirrors may cause stray light. Further, when laser beams enter the interior of a device, temperature rise or damage to the device are caused, and a malfunction such as chattering may occur. Therefore, with respect to a laser irradiation apparatus shown in FIG. 7, a beam spot is split by the diffractive optical element, and laser beams are gathered to a beam spot which is smaller than a micromirror. Here, when the micromirror has a distorted shape, the distortion increases particularly at the four corners of the micromirror. Accordingly, with the above configuration, variation of the shape of a beam spot due to distortion can be prevented. Note that a region at the center of a micromirror is a region provided with a post connected to a yoke which is an angle adjustment mechanism of the micromirror. Therefore, a configuration in which the beam spots are gathered to an area between the center region and a beam end may be used. Note that in the case of forming beam spots in such an area, the beam spot is required to be converged to about several μm. In this case, a configuration in which a beam spot formed by the diffractive optical element 104 is reduced and projected on the DMD 105 by a projection optical system may be used. With the above configuration, loss of laser beams at the DMD 105 can be prevented and efficiency in the use of laser beams can be improved.

Next, the laser beam deflected in the irradiation surface direction by the DMD 105 enters a projection lens 106 (FIG. 7). The projection lens is provided to project the beam spot formed on the DMD 105 on a substrate 108 which is the irradiation surface. Accordingly, the DMD 105 and the substrate 108 are arranged to be conjugated to each other. Here, the arrangement angles of the micromirrors constituting the DMD 105 are controlled digitally. For example, in the case of irradiating the substrate with a laser, when the tilt angle of the micromirror is set at +10°; and when the substrate is not irradiated with the laser, the tilt angle of the micromirror is set at −10°. Here, when the tilt angle of the micromirror is −10°, the laser beam reflected by the micromirror reach the light-shielding plate 107 and is blocked and thus not irradiating the surface of the substrate 108. With the above configuration, whether to perform irradiation (ON) on the substrate 108 with a laser beam or not (OFF) can be controlled; thus, a desired irradiation pattern can be formed on the substrate 108.

In this embodiment mode, the substrate 108 is attached to a suction stage 109. Further, the suction stage 109 is provided over a transfer stage 110 moved in the X-axis direction and a transfer stage 111 moved in the Y-axis direction. After thus finishing irradiation on an exposure region, the transfer stage 110 or 111 is moved, thereby another exposure region is irradiated with a desired irradiation pattern by a laser. Those steps are repeated as one cycle; thus, the entire surface of the substrate can be subjected to laser irradiation. Note that instead of using a suction stage, the substrate may be pressed against and attached to a stage by simply using a fixture in order to secure a substrate to a stage.

The laser irradiation apparatus described in this embodiment mode makes it possible to irradiate a plurality of portions on the organic compound layer with laser beams by single irradiation. Therefore, speed of writing data into a semiconductor device including a memory element having an organic compound layer can be improved and the productivity of the semiconductor device can be improved. Further, when the semiconductor device is use for an ID chip or the like for example, productivity of the ID chip or the like can be improved, and the ID chip or the like can be mass-produced at low cost.

Embodiment Mode 5

In this embodiment mode, an example of performing laser irradiation by splitting a laser beam into a plurality of laser beams using a reflective diffractive optical element and introducing the plurality of laser beams into a DMD.

Figure 8:
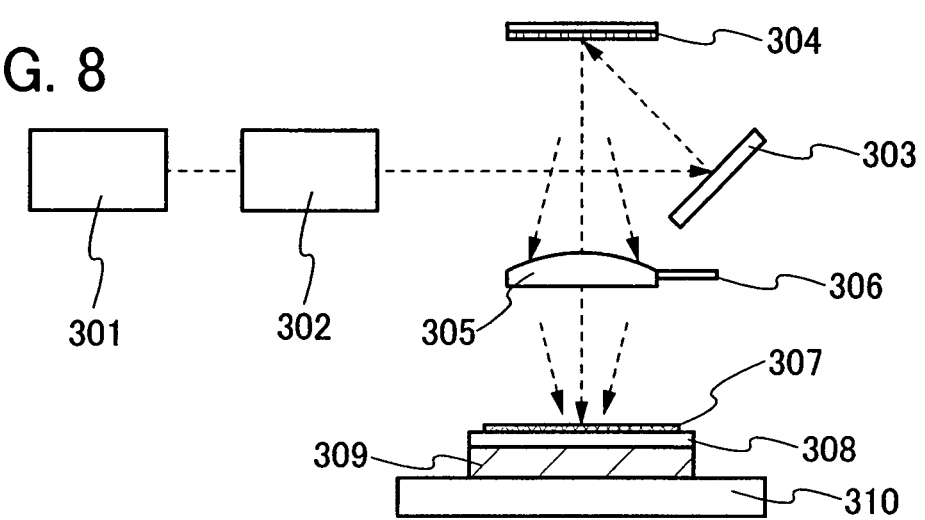
FIG. 8 shows a configuration example of a laser irradiation apparatus.

In FIG. 8, a laser beam emitted from a laser oscillator 301 enters an expander 302. Note that the broken line arrow in FIG. 8 indicates the direction of travel of the laser beam. The expander 302 has a function of magnifying a beam diameter of a laser beam, for example by arranging two projection lenses. A laser beam transmitted through the expander 302 enters a reflective diffractive optical element 303. Note that here, the expander 302 is used to alleviate design constrains on interval between cuts of the diffractive optical element 303 or the like. Accordingly, when the beam diameter of the laser beam emitted from the laser oscillator is large enough, the expander 302 need not be used. The diffractive optical element 303 is used to split a laser beam to form a plurality of beam spots. Further, the diffractive optical element is designed so that the plurality of beam spots of the split laser beams each have the same beam parameter. Thus, for example, even when a beam having Gaussian-like energy distribution is used, a plurality of beam spots having the same energy can be formed by using a diffractive optical element. Note that the diffractive optical element used here is for controlling the behavior of the laser beam due to the diffraction phenomenon of its surface structure. The diffractive optical element is designed by optimizing phase distribution using an ORA (Optimal Rotation Angle) method or the like. Further, the diffractive optical element can also be automatically designed with optical design software capable of wave optical analysis. As the diffractive optical element, a binary phase grating, a multilevel phase grating, a continuous phase grating, or the like can be applied.

Next, the laser beams split by the diffractive optical element 303 is converged to a DMD 304. The number of micromirrors constituting the DMD is equal to the number of the laser beams split by the diffractive optical element, and each laser beam is converged on the micromirror surface.

Next, the laser beam deflected in the irradiation surface direction by the DMD enters a projection lens 305 (FIG. 8). The projection lens is provided to project the beam spot formed on the DMD 304 on a substrate 307 which is the irradiation surface. Accordingly, the DMD 304 and the substrate 307 are arranged to be conjugated to each other. Here, the arrangement angles of the micromirrors constituting the DMD 304 are controlled digitally. For example, in the case of irradiating the substrate with a laser, when the tilt angle of the micromirror is set at +10°; and when the substrate is not irradiated with the laser, the tilt angle of the micromirror is set at −10°. Here, when the tilt angle of the micromirror is −10°, the laser beam reflected by the micromirror reach the light-shielding plate 306 and is blocked and thus not irradiating the surface of the substrate 307. With the above configuration, whether to perform irradiation (ON) on the surface of the substrate 307 with a laser beam or not (OFF) can be controlled; thus, a desired irradiation pattern can be formed on the substrate 307.

In this embodiment mode, the substrate 307 is attached to a suction stage 308. Further, the suction stage 308 is provided over a transfer stage 309 moved in the X-axis direction and a transfer stage 310 moved in the Y-axis direction. After thus finishing irradiation on an exposure region, the transfer stage 309 or 310 is moved, thereby another exposure region is irradiated with a desired irradiation pattern by a laser. Those steps are repeated as one cycle; thus, the entire surface of the substrate can be subjected to laser irradiation. Note that instead of using a suction stage, the substrate may be pressed against and attached to a stage by simply using a fixture in order to secure a substrate to a stage.

The laser irradiation apparatus described in this embodiment mode makes it possible to irradiate a plurality of portions on the organic compound layer with laser beams by single irradiation. Therefore, speed of writing data into a semiconductor device including a memory element having an organic compound layer can be improved and the productivity of the semiconductor device can be improved. Further, when the semiconductor device is use for an ID chip or the like for example, productivity of the ID chip or the like can be improved, and the ID chip or the like can be mass-produced at low cost.

Embodiment Mode 6

In this embodiment mode, a structure example of a memory circuit area including an organic compound layer having a different structure from FIG. 1 will be described. The case where the structure of the memory circuit area is passive matrix type will be described with reference to FIG. 9.

Figure 9A:
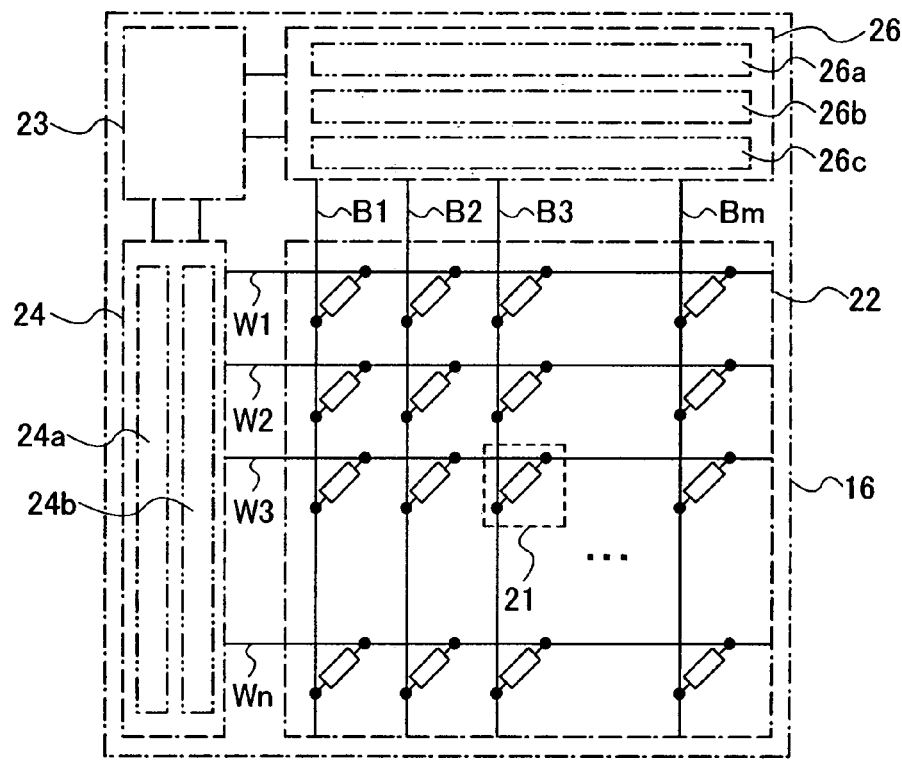
FIGS. 9A and 9B each show a configuration example of a semiconductor device.

FIG. 9A is a schematic view of a semiconductor device including a memory cell array 22 in which memory cells 21 are arranged in matrix; a bit line driver circuit 26 including a column decoder 26a, a read circuit 26b, and a selector 26c; a word line driver circuit 24 including a row decoder 24a and a level shifter 24b; and an interface 23 having a writing circuit, which communicates with outside. Note that the structure shown here is only an example; accordingly, the memory circuit area 16 may include another circuit such as a sense amplifier, an output circuit, a buffer, and the writing circuit may be provided on the bit line driver circuit.

The memory cell 21 has a structure in which an organic compound layer is provided between a pair of conductive layers (hereinafter also referred to as an organic memory element). Here, the organic memory element has a layered structure including a first conductive layer which forms a word line Wy ($1 \leq y \leq n$), an organic compound layer, and a second conductive layer which forms a bit line Bx ($1 \leq x \leq m$). The organic compound layer may have a single layer structure or a layered structure between the first conductive layer and the second conductive layer.

Figure 9B:
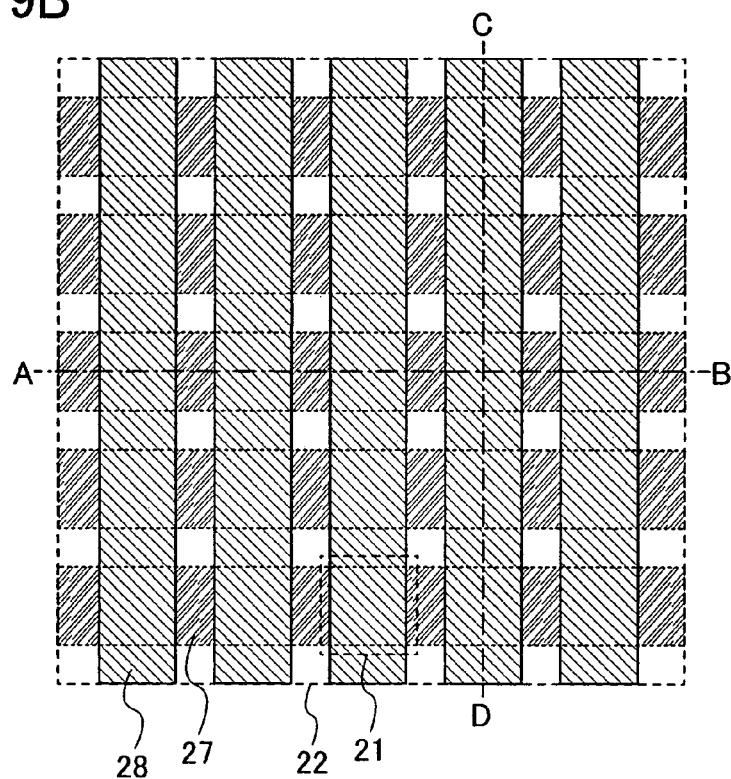

FIG. 9B is a schematic view of a planar structure of the memory cell array 22. The memory cell array 22 includes a first conductive layer 27 which extends in a first direction, an organic compound layer which covers the first conductive layer 27, and a second conductive layer 28 which extends in a second direction that is different from the first direction, in the perpendicular direction here. The organic compound layer is provided between the first conductive layer 27 and the second conductive layer 28. The first conductive layer 27 serves as the word line Wy and the second conductive layer 28 serves as the bit line Bx.

Next, a method for manufacturing a memory cell array including an organic memory element will be described with reference to FIGS. 10A to 10E. FIGS. 10A to 10E each shows an example of a cross-sectional structure along line A-B in FIG. 9A.

Figure 10A:
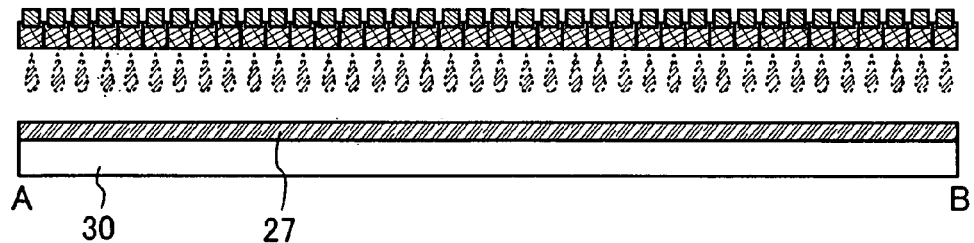
FIGS. 10A to 10E show steps of manufacturing a semiconductor device.

First, a first conductive layer 27 is formed by selectively discharging a conductive composition onto a substrate 30 (FIG. 10A). Further, the first conductive layer 27 may be formed by vapor deposition, sputtering, CVD, spin coating, screen printing, gravure printing, or the like without limitation to a droplet discharge method. For example, the first conductive layer 27 can be formed by depositing a conductive material over the entire surface by sputtering or CVD and thereafter selectively etching it by photolithography.

Figure 10B:
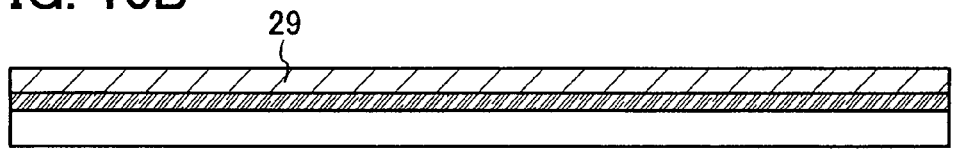

Next, an organic compound layer 29 is formed to cover the first conductive layer 27 (FIG. 10B). The organic compound layer 29 can be formed by a droplet discharge method, screen printing, gravure printing, spin coating, vapor deposition, or the like. Using such a method, the operation efficiency can be improved.

Figure 10C:
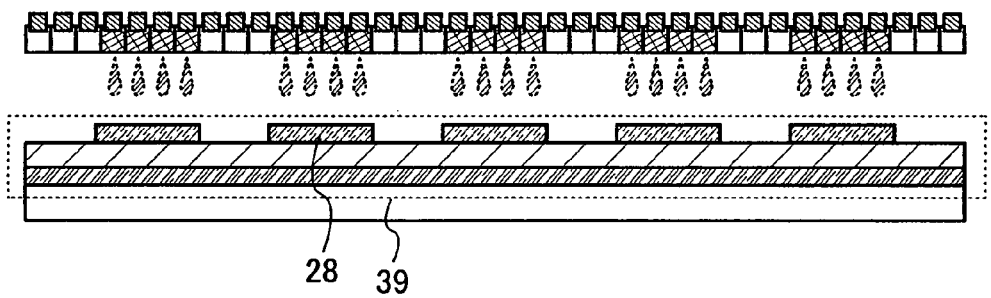

Next, a second conductive layer 28 is formed by selectively discharging a conductive composition onto an organic compound layer 29 (FIG. 10C). Here, a memory element portion 39 including a plurality of organic memory elements having a layered structure of the first conductive layer 27, the organic compound layer 29, and the second conductive layer 28. Further, the second conductive layer 28 can be formed by another method as described concerning the formation of the first conductive layer. The second conductive layer 28 may be formed by a different method from the first conductive layer 27. For example, the second conductive layer 28 can be directly and selectively formed by a droplet discharge method, screen printing, or the like while the first conductive layer 27 is formed by forming a conductive material over the entire surface by CVD or sputtering followed by selective etching. In this case, the second conductive layer 28 can be formed without etching, so that damages to the organic compound layer 29 can be suppressed.

Figure 10D:
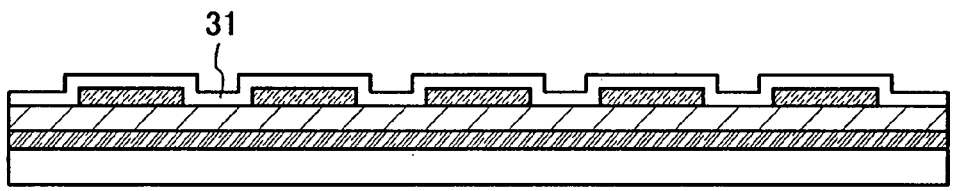
Figure 10E:
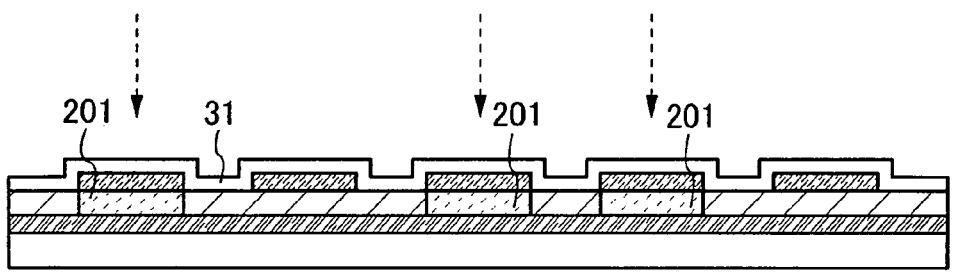

Next, insulating layer 31 serving as a protective film is provided so as to cover the second conductive layer 28 (FIG. 10D).

Through the above steps, a passive matrix memory cell array including an organic memory element can be formed. Then, the organic compound layer 29 is selectively irradiated with a laser beam by the laser irradiation apparatus shown in any one of Embodiment Modes 1 to 5 so as to partially destroy the organic compound layer 29; thus, data are written in the organic memory element. In this embodiment mode, a part of the organic compound layer which is destroyed by being carbonized and insulated is denoted as a region 201 (FIG. 10E). when an organic memory element having a destroyed organic compound layers and an organic memory element having an undestroyed organic compound layers are compared, electrical resistance between the first conductive layer 27 and the second conductive layer 28 in the former organic memory element is significantly higher.

Next, materials used in each step above will be specifically described below. As the substrate 30, for example, a glass substrate such as a barium borosilicate glass substrate or aluminoborosilicate glass substrate, a quartz substrate, a ceramic substrate, or the like can be used. Further, a metal substrate containing stainless-steel or a semiconductor substrate in each of which an insulating layer is formed on the surface may be used. Although a substrate made of a flexible synthetic resin, such as PET generally has lower heat-resistance than the above-described substrate, it can be used as long as it can withstand process temperature in the manufacturing steps. The surface of the substrate 30 may be planarized in advance by polishing such as a CMP method.

Further, the first conductive layer 27 and the second conductive layer 28 may have a single layer containing an element selected from gold (Au), silver (Ag), platinum (Pt), nickel (Ni), tungsten (W), chromium (Cr), molybdenum (Mo), iron (Fe), cobalt (Co), copper (Cu), palladium (Pd), carbon (C), aluminum (Al), manganese (Mn), and titanium (Ti), tantalum (Ta) or an alloy containing a plurality of the elements. As the alloy containing a plurality of the elements, for example, an alloy containing Al, Ti, and C, an alloy containing Al and Ni, an alloy containing Al and C, an alloy containing Al, Ni, and C, an alloy containing Al and Mo, or the like can be used. Alternatively, a conductive polymer of which conductivity is improved by doping or the like, such as conductive polyaniline, conductive polypyrrole, or conductive polythiophen, a complex of polyethylene dioxythiophene (PEDOT) and polystyrenesulphonic (PSS), or the like can be used. Further, a light-transmitting conductive material which transmits a laser beam is preferably used as a conductive layer (the second conductive layer 28 in this embodiment mode) formed on the side which is to be irradiated. As the light-transmitting conductive material, indium tin oxide (ITO), zinc oxide (ZnO), indium zinc oxide (IZO), zinc oxide added with gallium (GZO), or the like can be used. Indium tin oxide containing silicon oxide (hereinafter referred to as ITSO) or a target in which 2 wt % to 20 wt % of zinc oxide (ZnO) is mixed into ITSO may be used instead. The conductive layers can be formed by a droplet discharge method, vapor deposition, sputtering, CVD, spin coating, screen printing or gravure printing using the above material. For example, Ag can be selectively applied by a droplet discharge method, or Al can be deposited by vapor deposition to form the conductive layer.

The organic compound layer 29 is provided to have a single layer structure or a layered structure of a layer containing conductive organic compound material. Specific examples of a conductive organic compound material include a high molecular weight compound having a carrier transporting property and the like.

As a high molecular weight compound having a carrier transporting property, poly (p-phenylene vinylene) (PPV), [methoxy-5-(2-ethyl) hexyloxy]-p-phenylene vinylene (MEH-PPV), poly (9,9-dialkylfluorene) (PAF), poly (9-vinylcarbazole) (PVK), polypyrroles, polythiophens, polyacetylenes, poly pyrenes, poly carbazoles, or the like can be used. Further, oligomer or the like with lower degree of polymerization than the above high molecular weight compound may be used. The organic compound layer 29 can be formed by spin coating, a droplet discharge method, screen printing, gravure printing, vapor deposition, or the like by using these materials.

As an insulating layer 31, a layer or a stack of an inorganic material containing oxygen or nitrogen or the like, such as silicon oxide (SiOx), silicon nitride (SiNx), silicon oxynitride (SiOxNy)(x>y), silicon nitride oxide (SiNxOy)(x>y), or the like can be used. Alternatively, an organic material such as polyimide, polyamide, polyvinyl phenol, benzocyclobutene, acrylic, epoxy, or siloxane may be used in the single layer or the stack. A stack of an organic compound material and an inorganic compound material may be provided instead. A siloxane material is a material containing a Si—O—Si bond. Siloxane has a skeleton of a bond of silicon (Si) and oxygen (O). As the substituent, an organic group containing at least hydrogen (for example, an alkyl group or aromatic hydrocarbon) may be used. As another substituent, a fluoro group may be used. Alternatively, both an organic group containing at least hydrogen and a fluoro group may be used as the substituent.

Note that the structure shown in FIGS. 10A to 10E are only examples, and the structure is not limited thereto. The case of another structure are shown in FIGS. 11A to 11E.

Figure 11A:
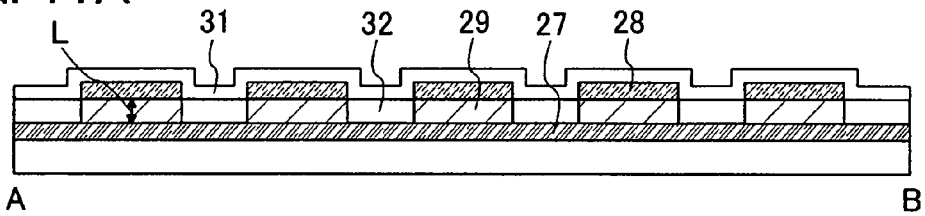
FIGS. 11A to 11E each show a structure example of a semiconductor device.

In FIGS. 10A to 10E, an organic compound layer 29 is formed so as to cover the entire surface of a first conductive layer 27. However, if influence of electric field in lateral directions between adjacent memory cells is feared, an insulating layer 32 may be provided between organic compound layers provided in memory cells so that the organic compound layers provided in memory cells are isolated from each other (FIG. 11A). In other words, an organic compound layer may be selectively provided in each memory cell. In this case, the organic compound layers can be selectively formed in memory cells efficiently by a droplet discharge method, screen printing, gravure printing, or the like.

Figure 11B:
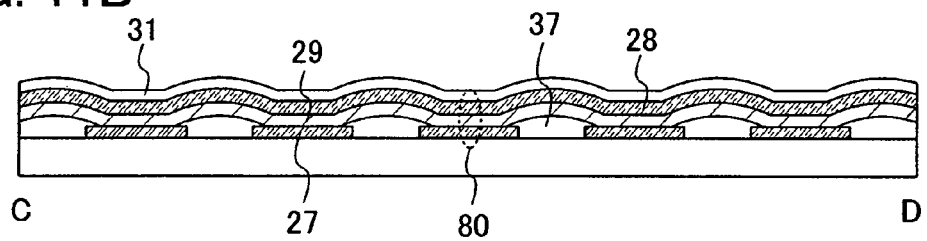

Further, in providing the organic compound layer 29 covering the first conductive layer 27, insulating layer 37 may be provided to cover an end portion of the first conductive layer 27 thereby preventing disconnection of the organic compound layer 29 due to the level differences between each first conductive layer 27 and influence of electric field in lateral directions between each memory cell (FIG. 11B). In that case, the insulating layer 37 may be selectively provided between a plurality of the first conductive layers 27.

Figure 11C:
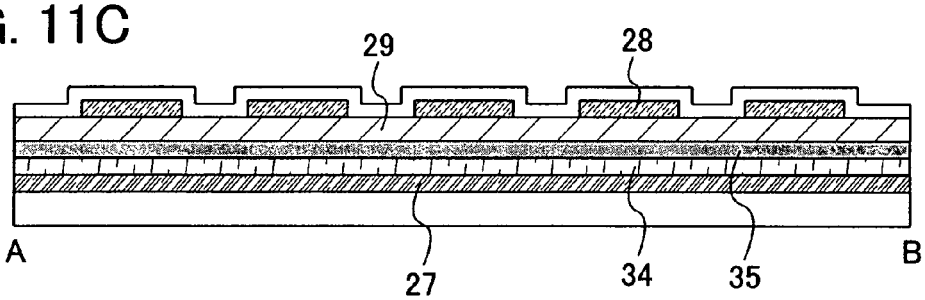
Figure 11D:
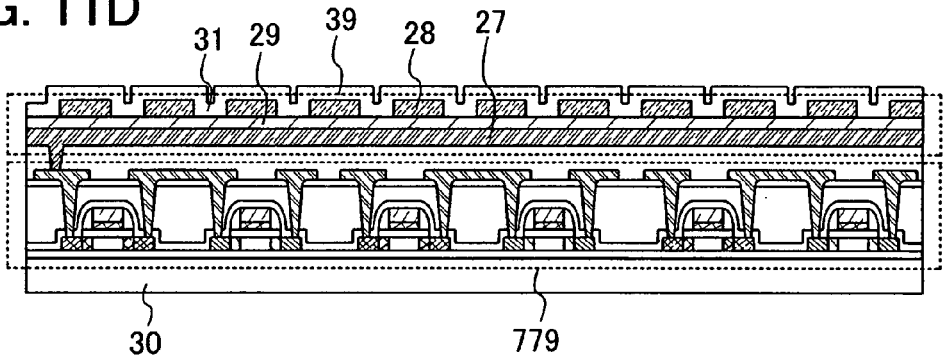

Further, in the structures shown in FIGS. 10A to 10E, a rectifying element may be provided between the first conductive layer 27 and the organic compound layer 29 (FIG. 11C). As a typical rectifying element, a Schottky diode, a diode having a PN junction, a diode having a PIN junction, or a transistor in which a gate electrode and a drain electrode are connected can be used. Naturally, the rectifying element may be a diode having another structure. Here, a PN junction diode including semiconductor layers 34 and 35 between the first conductive layer and the organic compound layer is provided. One of the semiconductor layers 34 and 35 is an N-type semiconductor while the other is a P-type semiconductor. Thus, the accuracy and margin of reading and writing can be improved by providing the rectifying element.

Figure 11E:
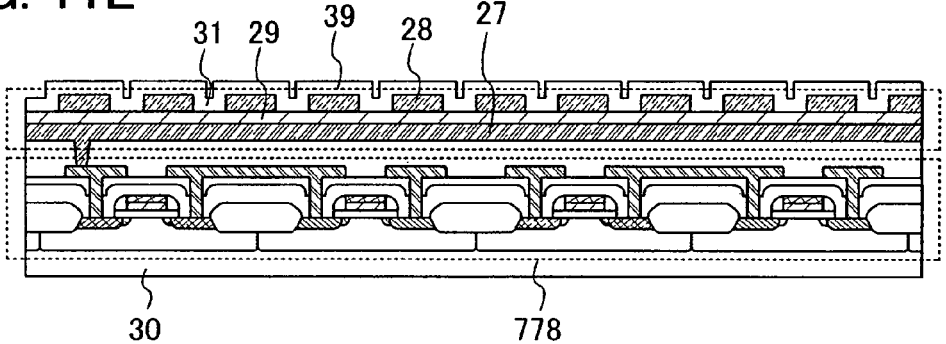

Further, a structure in which a memory element portion 39 including a plurality of memory elements is provided over the substrate 30 is shown in FIGS. 10A to 10E. However, the structure is not limited thereto, and the memory element portion 39 may be formed above thin film transistors (TFT) 779 provided over a substrate 30 (FIG. 11D), or the memory element portion 39 may be provided over filed effect transistors (FET) 778 formed over the substrate 30, which is a semiconductor substrate such as a Si substrate or an SOI substrate. Incidentally, the FETs 778 uses the substrate 30 as a channel formation region of the transistors (FIG. 11E). Examples of forming the memory element portion 39 over the thin film transistors 779 or the field effect transistors 778 are shown here; however, the memory element portion 39 and the thin film transistors 779 or the memory element portion 39 and the field effect transistors 778 may be attached to each other. In this case, the memory element portion 39 and the thin film transistors 779 or the memory element portion 39 and the field effect transistors 778 may be manufactured in separate processes and may be adhered to each other using a conductive film, or the like. Further, the thin film transistors 779 or the field effect transistors 778 may have any known structure.

Thus, in this embodiment mode, the organic compound layer in the memory element can be formed by a droplet discharge method, spin coating, a printing method such as screen printing or gravure printing, or the like. Therefore, a memory device or a semiconductor device can be manufactured easily at low cost. Further, a memory element portion described in this embodiment mode can be manufactured with a minute structure, so that a semiconductor device having memory circuit with high capacity can be obtained.

Embodiment Mode 7

In this embodiment mode, another example of a semiconductor device different from the above embodiment mode will be explained with reference to drawings.

A semiconductor device shown in this embodiment mode is capable of non-contact reading and writing of data. Data transmission methods are broadly classified into three, an electromagnetic coupling method of communicating by mutual induction with a pair of coils disposed in the opposed position, an electromagnetic induction method of communicating by an inductive electromagnetic field, and an electric wave method of communicating by using electric waves, and any of these methods may be employed. An antenna that is used for transmitting data can be provided in two ways. One way is to provide the antenna over a substrate provided with a plurality of elements, memory elements, and the like, and the other way is to provide a terminal portion over a substrate provided with a plurality of elements, memory elements, and the like and to connect an antenna provided over another substrate to the terminal portion.

First, an example of a structure of a semiconductor device in the case of providing an antenna over a substrate provided with a plurality of elements, memory elements, and the like will be explained with reference to FIGS. 12A and 12B.

Figure 12A:
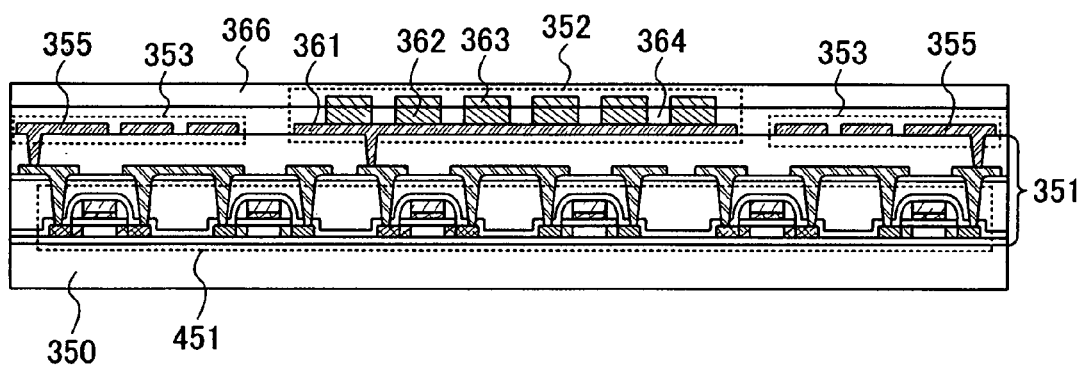
FIGS. 12A and 12B each show a manufacturing example of a semiconductor device.

FIG. 12A shows a semiconductor device including a passive matrix organic memory. An element formation layer 351 including a plurality of transistors 451 is provided over a substrate 350, and a memory element portion 352 including a plurality of organic memory elements and an antenna portion 353 are provided above the element formation layer 351. The case of providing the memory element portion 352 or the antenna portion 353 above the element formation layer 351 is shown here; however, the structure is not limited thereto. The memory element portion 352 or the antenna portion 353 can be provided below the element formation layer 351 or in the same layer.

As the substrate 350, for example, a glass substrate such as a barium borosilicate glass substrate or aluminoborosilicate glass substrate, a quartz substrate, a ceramic substrate, or the like can be used. Further, a metal substrate containing stainless-steel or a semiconductor substrate in each of which an insulating layer is formed on the surface may be used. Although a substrate made of a flexible synthetic resin, such as PET, generally has lower heat-resistance than the above-described substrate, it can be used as long as it can withstand process temperature in the manufacturing steps. The surface of the substrate 350 may be planarized in advance by polishing such as a CMP method.

A plurality of organic memory elements included in the memory element portion 352 are provided with a stack of a first conductive layer 361, an organic compound layer 362, and a second conductive layer 363, and an insulating layer 366 which functions as a protective film is provided so as to cover the second conductive layer 363. Here, an insulating layer 364 is provided between each memory cell (between the plurality of organic memory elements) so that an organic compound layer is provided in each memory cell; however, the organic compound layer 362 may be formed over the entire surface so as to cover the first conductive layer 361. Note that the memory element portion 352 can be formed using materials and methods shown in the above embodiment modes.

In the memory element portion 352, a rectifying element may be provided between the first conductive layer 361 and the organic compound layer 362 or between the organic compound layer 362 and the second conductive layer 363 shown in the above embodiment mode. The rectifying element can be one of the above-described ones.

In an antenna portion 353, a conductive layer 355 which functions as an antenna is provided. Here, the conductive layer 355 is provided on the same layer as the first conductive layer 361, and the same material may be used to form the conductive layer 355 and the first conductive layer 361. The conductive layer 355 may be formed on the insulating layer 364 or the insulating layer 366. When the conductive layer 355 is provided over the insulating layer 364, it can be formed using the same material as the second conductive layer 363.

The conductive layer 355 which functions as an antenna is connected to a transistor partly constituting a waveform shaping circuit or a rectifying circuit. Here, the conductive layer 355 which functions as an antenna is connected to any one of the plurality of the transistors 451. After the data sent from the outside without contact is processed in a waveform shaping circuit or a rectifying circuit, data exchange (data writing or data reading) is carried out in the organic memory element via a read circuit or a write circuit.

As the material of the conductive layer 355, an element selected from gold (Au), silver (Ag), platinum (Pt), nickel (Ni), tungsten (W), molybdenum (Mo), cobalt (Co), copper (Cu), aluminum (Al), manganese (Mn), or titanium (Ti) or an alloy containing a plurality of the elements can be used. Further, vapor deposition, sputtering, CVD, a droplet discharge method, gravure printing, screen printing, or the like may be used to form the conductive layer 355.

The element formation layer 351 includes at least a transistor. Using the transistor, any kind of integrated circuit such as a CPU (central processing unit), a memory, or a microprocessor can be provided. Further, in this embodiment mode, the transistors 451 included in the element formation layer 351 can be a p-channel TFT or an n-channel TFT. Further, any structure may be used for a semiconductor layer included in the transistors 451. For example, an impurity region (including a source region, a drain region, and an LDD region) may be formed. An insulating layer (sidewall) may be provided to be in contact with a side face of the gate electrode, or a silicide layer may be formed for a source region, a drain region, and the gate electrode. As a material for the silicide layer, nickel, tungsten, molybdenum, cobalt, platinum, or the like can be used.

The transistors 451 included in the element formation layer 351 each may be an organic transistor in which the channel formation region is formed of an organic material. In this case, the element formation layer 351 having the organic transistors can be formed by printing or a droplet discharge method directly over the substrate 350 that is a flexible substrate such as a plastic substrate. Further, in that case, a semiconductor device can be manufactured at low cost by also forming the memory element portion 352 by a droplet discharge method, screen printing, gravure printing, or the like as described above.

Figure 12B:
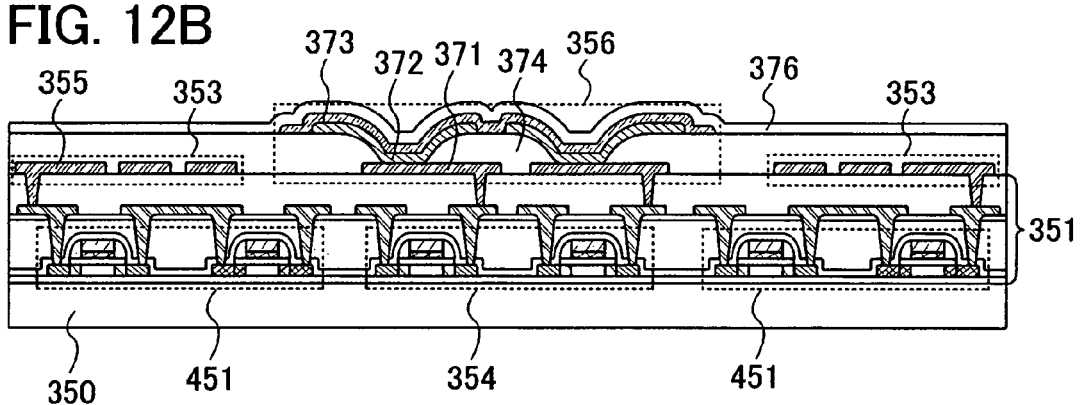

FIG. 12B shows an example of a semiconductor device having an active matrix organic memory. Note that part of FIG. 7B which is different from FIG. 7A will be explained.

As for a semiconductor device shown in FIG. 12B, an element formation layer 351 including transistors 451 and 354 is provided over a substrate 350, a memory element portion 356 and an antenna portion 353 are provided above the element formation layer 351. Here, the transistor 354 which functions as a switching element of the memory element portion 356 is provided on the same layer as the transistor 451, and the memory element portion and the antenna portion 353 are formed above the element formation layer 351. However, the structure is not limited thereto, and the transistor 354 may be provided above or below the element formation layer 351, or the memory element portion 356 and the antenna portion 353 can be provided below or in the same layer as the element formation layer 351.

The plurality of organic memory elements included in the memory element portion 356 has a stack of a first conductive layer 371, an organic compound layer 372, and a second conductive layer 373, and an insulating layer 376 is provided as a protective film so as to cover the second conductive layer 373. Here, the insulating layer 374 is formed to cover an end of the first conductive layer 371, and the organic compound layer 372 is selectively formed in each memory cell; however, the organic compound layer 372 may be formed over the entire surface so as to cover the first conductive layer 371 and the insulating layer 374. The memory element portion 356 can be formed using materials and methods shown in the above embodiment modes. Further, in the memory element portion 356, a rectifying element may also be provided between the first conductive layer 371 and the organic compound layer 372 or between the second conductive layer 373 and the organic compound layer 372, as described above.

The conductive layer 355 provided in the antenna portion 353 may be formed on the same layer as the first conductive layer 371 or over the insulating layer 374 or the insulating layer 376. In the case where the conductive layer 355 is provided on the same layer as the first conductive layer 371 or the second conductive layer 373, the conductive layer 355 can be formed from the same material as the first conductive layer 371 or the second conductive layer 373 in the same process step. The conductive layer 355 which functions as an antenna is connected to a transistor partly constituting a waveform shaping circuit or a rectifying circuit. Here, the conductive layer 355 which functions as an antenna is connected to any one of the transistors constituting a waveform shaping circuit or a rectifying circuit. After the data sent from the outside without contact is processed in a waveform shaping circuit or a rectifying circuit, data exchange (data writing or data reading) is carried out in the organic memory element via a read circuit or a write circuit.

The transistors 354 provided in the element formation layer 351 each function as a switching element in writing or reading data into the plurality of organic memory elements included the memory element portion 356. Therefore, the transistors 354 are preferably a P-channel type or an N-channel type. Further, a semiconductor layer included in the transistors 354 may have any structure. For example, an impurity region (including a source region, a drain region, and an LDD region) may be formed, and either a P-channel type or an N-channel type may be used. An insulating layer (sidewall) may be provided to be in contact with a side face of the gate electrode, or a silicide layer may be formed for a source region, a drain region, and the gate electrode. As a material for the silicide layer, nickel, tungsten, molybdenum, cobalt, platinum, or the like can be used.

Further, the element formation layer 351, the memory element portion 356, and the antenna portion 353 can be formed by vapor deposition, sputtering, CVD, a droplet discharge method, screen printing, gravure printing, or the like. In addition, different methods may be used to form different parts. For example, the transistors 451 which is required to operate at high speed can be provided by crystallizing a semiconductor layer such as a Si layer formed over a substrate, and the transistors 354, each of which function as a switching element, can be provided as organic transistors above the element formation layer 351 with the use of a droplet discharge method, screen printing, gravure printing, or the like.

The memory element 356 shown in FIG. 12B has a structure in which the first conductive layer 371 is connected to a source electrode or a drain electrode of a transistor 354 of the element formation layer 351 with an insulating layer provided. However, the first conductive layer 371 may be provided on the same layer as the source electrode or drain electrode of the transistor 354. In FIG. 12B, the organic compound layer 372 is selectively provided in each memory cell; however, the organic compound layer may be formed over the entire surface. In the case where an organic compound layer is separately provided in each memory cell, a droplet discharge method, screen printing, gravure printing, or the like is preferably used. Meanwhile, in the case where an organic compound layer is provided over the entire surface, spin coating, vapor deposition, or the like is preferably used.

Figure 13A:
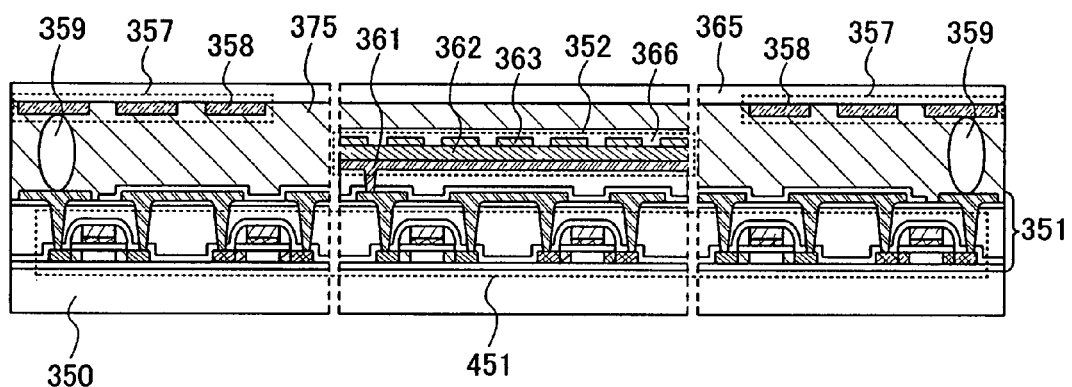
FIGS. 13A and 13B each show a manufacturing example of a semiconductor device.
Figure 13B:
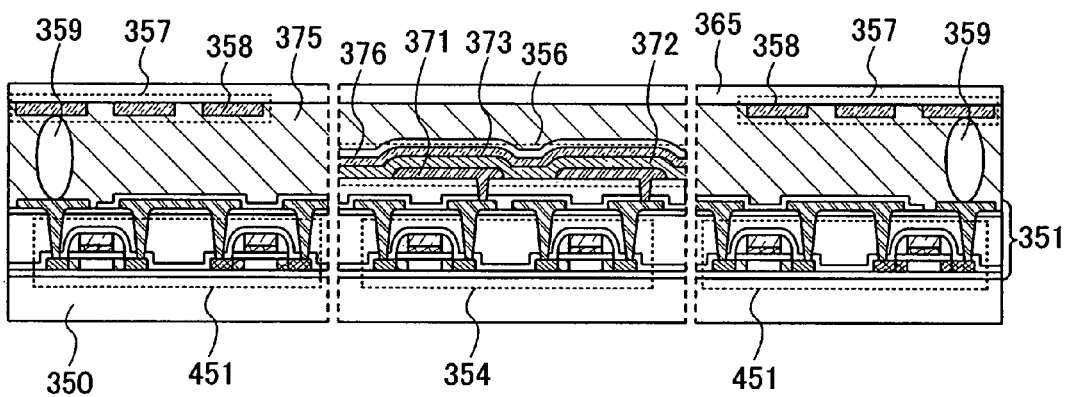

Next, an example of a structure of a semiconductor device in which a terminal portion is provided on a substrate provided with a plurality of elements and memory elements, and an antenna provided on another substrate is connected to the terminal portion will be descried with reference to FIGS. 13A and 13B. Note that part in FIGS. 13A and 13B which is different from FIGS. 12A and 12B will be described.

FIG. 13A shows a semiconductor device including a passive matrix organic memory. The element formation layer 351 including a plurality of transistors 451 is provided over a substrate 350, a memory element portion 352 including a plurality of organic memory elements is provided above the element formation layer 351, and an antenna portion 357 provided over a substrate 365 is provided so as to connect to the transistors 451 of the element formation layer 351. Here, the memory element portion 352 or the antenna portion 357 is provided above the element formation layer 351; however, the structure is not limited thereto. The memory element portion 352 may be provided below or in the same layer as the element formation layer 351, or the antenna portion 357 may be provided below the element formation layer 351.

The organic memory element of the memory element portion 352 has a stack of a first conductive layer 361, an organic compound layer 362, and a second conductive layer 363. When disconnection in the organic compound layer 362 or influence of electric field in lateral directions between each adjacent memory cell is feared, an insulating layer may be provided between memory cells to isolate the organic compound layer. Note that the memory element portion 352 can be formed using materials and methods shown in the above embodiment modes.

The substrate provided with the element formation layer 351 and the memory element portion 352 is attached to the substrate 365 provided with the antenna portion 357 with an adhesive resin 375. The element formation layer 351 and a conductive layer 358 are electrically connected via conductive fine particles 359 contained in the resin 375. Alternatively, the substrate provided with the element formation layer 351 and the memory element portion 352 may be attached to the substrate 365 provided with the antenna portion 357 using a conductive adhesive such as silver paste, copper paste, or carbon paste, or by solder bonding.

FIG. 13B shows a semiconductor device provided with an active matrix organic memory. The element formation layer 351 including transistors 451 and 354 is provided over a substrate 350, a memory element portion 356 including a plurality of organic memory elements is provided above the element formation layer 351, and an antenna portion 357 provided over a substrate 365 is provided so as to connect to the element formation layer 351. Here, the transistor 354 is provided in the same layer as the transistor 451 in the element formation layer 351, and the antenna portion 357 is provided above the element formation layer 351; however, the structure is not limited thereto. The memory element portion 356 may be provided below or on the same layer as the element formation layer 351, or the antenna portion 357 may be provided below the element formation layer 351.

The organic memory element included in the memory element portion 356 has a stack of a first conductive layer 371, an organic compound layer 372, and a second conductive layer 373. When influence of electric field in lateral directions between each adjacent memory cell is feared, an insulating layer may be provided between each memory cell to isolate the organic compound layer. Note that the memory element portion 356 can be formed using materials and methods shown in the above embodiment modes.

Further, also in FIG. 13B, the substrate provided with the element formation layer 351 and the memory element portion 356 is attached to the substrate provided with the antenna portion 357 using the resin 375 containing conductive fine particles 359.

Thus, a semiconductor device provided with an organic memory and an antenna can be formed. Further, in this embodiment mode, thin film transistors are provided as the transistors 354 and 451 over the substrate 350. Alternatively, a semiconductor substrate such as a Si substrate is used for the substrate 350 and field effect transistors (FETs) may be formed over the substrate so as to provide the transistors 354 and 451. Furthermore, an SOI substrate may be used for the substrate 350 and the transistors 354 and 451 may be fabricated using the substrate. In this case, the SOI substrate can be formed by attaching wafers or by using a method called SIMOX by which an insulating layer is formed inside a substrate by implanting oxygen ions into a Si substrate.

Embodiment Mode 8

In this embodiment mode, a method of manufacturing a semiconductor device including a thin film transistor, a memory element, and an antenna according to the invention will be described with reference to the drawings.

First, a release layer 702 is formed over a surface of a substrate 701 (FIG. 14A). The substrate 701 may be a glass substrate, a quartz substrate, a substrate in which an insulating layer is formed over a surface of a metal substrate, or a stainless-steel substrate, or a plastic substrate which can resist the treatment temperature of the manufacturing process. In the case of using such a substrate, the area and the shape thereof are not particularly restricted; therefore, by using a rectangular substrate with at least one meter length on a side, the productivity can be drastically improved, for example. This merit is greatly advantageous as compared to the case of using a circular silicon substrate. In addition, the release layer 702 is formed over an entire surface of the substrate 701 in the process; however, the release layer 702 may be selectively provided by using photolithography after the release layer is formed over the entire surface of the substrate 701 as necessary. It is to be noted that the release layer 702 is formed so as to contact the substrate 701; however, an insulating layer may be formed as a base film to contact the substrate 701 as necessary and the release layer 702 may be formed to contact the insulating layer.

The release layer 702 is formed in a single layer or a layered structure with a film using an element selected from tungsten (W), molybdenum (Mo), titanium (Ti), tantalum (Ta), niobium (Nb), nickel (Ni), cobalt (Co), zirconium (Zr), zinc (Zn), ruthenium (Ru), rhodium (Rh), lead (Pb), osmium (Os), iridium (Ir), or silicon (Si), an alloy material or a compound material containing the above described element as its main component by sputtering, plasma CVD, or the like. The structure of the layer containing silicon may have any structure of amorphous, microcrystal, or polycrystalline structure.

In the case where the release layer 702 has a single layer structure, a tungsten layer, a molybdenum layer, or a layer containing a mixture of tungsten and molybdenum may be formed, for example. Alternatively, a layer containing oxide or oxynitride of tungsten, a layer containing oxide or oxynitride of molybdenum, or a layer containing oxide or oxynitride of a mixture of tungsten and molybdenum may be formed. It is to be noted that a mixture of tungsten and molybdenum is an alloy of tungsten and molybdenum, for example. Further, oxide of tungsten can be referred to as tungsten oxide.

In the case where the release layer 702 has a layered structure, a tungsten layer, a molybdenum layer, or a layer containing a mixture of tungsten and molybdenum may be formed as a first layer. A layer containing oxide, nitride, oxynitride, or nitride oxide of tungsten, a layer containing oxide, nitride, oxynitride, or nitride oxide of molybdenum, or a layer containing oxide, nitride, oxynitride, or nitride oxide of a mixture of tungsten and molybdenum may be formed as a second layer.

When a stack of a layer containing tungsten and a layer containing oxide of tungsten is formed as the release layer 702, the layer containing tungsten is formed and a layer containing silicon oxide may be formed so that oxide of tungsten is formed at the interface between the tungsten layer and the silicon oxide layer. This also applies to the case where a layer containing nitride, oxynitride, and nitride oxide of tungsten. In this case, after a layer containing tungsten is formed, a silicon nitride layer, a silicon oxynitride layer, a silicon nitride oxide layer may be formed thereover. The tungsten oxide is denoted by WOx and X is in the range of 2 to 3; there are $WO_2$ in the case where X is 2, $W_2O_5$ in the case where X is 2.5, $W_4O_{11}$ in the case where X is 2.75, $WO_3$ in the case where X is 3, and the like. In forming an oxide of tungsten, the above value of X is not limited in particular, and an oxide to be formed can be determined based on an etching rate or the like. The layer containing tungsten oxide (WOx, 0<X<3) which is formed by sputtering in an oxygen atmosphere is preferable to obtain the most preferable etching rate. Therefore, in order to reduce time of manufacture, the release layer may preferably be formed with a layer containing tungsten oxide which is formed by sputtering in an oxygen atmosphere. Alternatively, in the case of providing a release layer having a layered structure of a metal layer and a layer containing a metal oxide, the release layer may be formed by forming the metal layer, and then treating the metal layer with plasma treatment to form a metal oxide film. A metal oxide film, a metal oxide nitride film, or the like can be formed on the metal film by performing plasma treatment in an oxygen atmosphere or a nitrogen atmosphere.

Next, an insulating layer 703 to be a base is formed to cover the release layer 702. The insulating layer 703 to be the base is formed by a layer containing oxide of silicon or nitride of silicon in a single layer or a layered structure with a layer containing oxide of silicon or nitride of silicon by sputtering, plasma CVD, or the like. Oxide of silicon is a material containing silicon (Si) and oxygen (O), such as silicon oxide, silicon oxynitride, or silicon nitride oxide. Nitride of silicon is a material containing silicon and nitrogen (N), such as silicon nitride, silicon oxynitride, or silicon nitride oxide. In the case where the insulating layer to be the base has a two-layer structure, a silicon nitride oxide layer may be formed as a first layer, and a silicon oxynitride layer may be formed as a second layer, for example. In the case where the insulating layer to be a base has a three-layer structure, a silicon oxide layer, a silicon nitride oxide layer, and a silicon oxynitride layer may be formed as a first-layer insulating layer, a second-layer insulating layer, and a third-layer insulating layer respectively. Alternatively, a silicon oxynitride layer, a silicon nitride oxide layer, and a silicon oxynitride layer may be formed as a first-layer insulating layer, a second-layer insulating layer, and a third-layer insulating layer respectively. The insulating layer to be the base functions as a blocking film for preventing impurities entering from the substrate 701.

Subsequently, an amorphous semiconductor layer 704 (for example, a layer containing amorphous silicon) is formed over the insulating layer 703. The amorphous semiconductor layer 704 is formed to a thickness of 25 nm to 200 nm (preferably 30 nm to 150 nm) by sputtering, LPCVD, plasma CVD, or the like. The amorphous semiconductor layer 704 is crystallized by a laser crystallization method, a thermal crystallization method using an RTA or an annealing furnace, a thermal crystallization method using a metal element for promoting crystallization, a method in which the laser crystallization method is combined with the thermal crystallization method using a metal element for promoting crystallization, or the like, to form a crystalline semiconductor layer. The obtained crystalline semiconductor layer is then etched into a desired shape, thereby crystalline semiconductor layers 706 to 710 are formed (FIG. 14B).

An example of formation steps of the crystalline semiconductor layers 706 to 710 will be described briefly as follows. First, an amorphous semiconductor layer is formed to a thickness of 66 nm by plasma CVD. Next, a solution containing nickel that is a metal element for promoting crystallization is applied onto the amorphous semiconductor layer, and dehydrogenation treatment (at 500° C., for 1 hour) and thermal crystallization treatment (at 550° C., for 4 hours) are performed on the amorphous semiconductor layer, thereby a crystalline semiconductor layer is formed. After that, the crystalline semiconductor layer is irradiated with a laser beam as needed, and photolithography is performed to form the crystalline semiconductor layers 706 to 710. In the case where the laser crystallization method is employed for forming the crystalline semiconductor layer, a continuous wave or pulsed gas laser or solid-state laser may be used. As the gas laser, an excimer laser is used. As the solid-state laser, a laser using a crystal such as YAG, YVO$_4$, YLF, and YAlO$_3$ doped with Yb, Cr, Nd, Er, Ho, Ce, Co, Ti, or Tm; a glass laser, a ruby laser, a Ti: sapphire laser, or the like may be used.

In addition, the crystallization of the amorphous semiconductor layer by using the metal element for promoting crystallization is advantageous because the crystallization can be performed at low temperature in short time and the direction of crystals becomes uniform. Meanwhile, there is also a problem that the characteristics are not stable because the off-state current is increased due to a residue of the metal element in the crystalline semiconductor layer. Therefore, it is preferable to form an amorphous semiconductor layer as a gettering site over the crystalline semiconductor layer. The amorphous semiconductor layer to be a gettering site is required to contain an impurity element such as phosphorous or argon; accordingly, it is preferably formed by sputtering by which argon can be contained at high concentration. Subsequently, heat treatment (RTA, thermal annealing using an annealing furnace, or the like) is performed to diffuse the metal element into the amorphous semiconductor layer, and the amorphous semiconductor layer containing the metal element is removed therefrom. In this manner, the content of the metal element in the crystalline semiconductor layer can be reduced or eliminated.

Then, a gate insulating film 705 is formed to cover the crystalline semiconductor layers 706 to 710. The gate insulating film 705 is formed with a single layer or a stack of a layer containing oxide of silicon or nitride of silicon by plasma CVD or sputtering. Specifically, a layer containing silicon oxide, a layer containing silicon oxynitride, or a layer containing silicon nitride oxide is formed in a single layer or layered structure.

Subsequently, a first conductive layer and a second conductive layer are stacked on the gate insulating film 705. The first conductive layer is formed to a thickness of 20 to 100 nm by plasma CVD or sputtering. The second conductive layer is formed to a thickness of 100 to 400 nm. The first conductive layer and the second conductive layer are formed by using an element selected from tantalum (Ta), tungsten (W), titanium (Ti), molybdenum (Mo), aluminum (Al), copper (Cu), chromium (Cr), niobium (Nb), or the like, an alloy material or a compound material containing the above-described element as its main component. Alternatively, a semiconductor material, typically poly-crystalline silicon doped with an impurity element such as phosphorus, may be used. As a combination of the first conductive layer and the second conductive layer, a tantalum nitride layer and a tungsten layer, a tungsten nitride layer and a tungsten layer, a molybdenum nitride layer and a molybdenum layer, or the like can be used for example. Since tungsten, tantalum nitride, or the like has high heat resistance, heat treatment for thermal activation can be performed after the first conductive layer and the second conductive layer are formed. Alternatively, in the case of employing a three-layer structure instead of a two-layer structure, a layered structure of a molybdenum layer, an aluminum layer, and a molybdenum layer may be employed.

Then, a resist mask is formed by photolithography and etching treatment for forming a gate electrode and a gate line is performed, thereby conductive layers 716 to 725 (also referred to as gate electrodes layers) functioning as gate electrodes are formed.

Next, another resist mask is formed by photolithography. Then, an impurity element imparting N-type conductivity is added into the crystalline semiconductor layers 706, and 708 to 710 at low concentration by ion doping or ion implantation to form N-type impurity regions 711, and 713 to 715 and channel formation regions 780, and 782 to 784. An element belonging to group 15 of Periodic Table may be used for the impurity element imparting N-type conductivity. For example, phosphorus (P) or arsenic (As) is used.

Next, another resist mask is formed by photolithography. Then, an impurity element imparting p-type conductivity is added into the crystalline semiconductor layer 707 to form a p-type impurity region 712 and a channel formation region 781. For example, boron (B) is used for the impurity element imparting p-type conductivity.

Next, an insulating layer is formed so as to cover the gate insulating film 705 and the conductive layers 716 to 725. The insulating layer is formed with a single layer or a stack of a layer containing an inorganic material such as silicon, oxide of silicon, or nitride of silicon, or a layer containing an organic material such as an organic resin by plasma CVD or sputtering. Then, the insulating layer is selectively etched by anisotropic etching mainly in the vertical direction, thereby insulating layers (also referred to as sidewalls) 739 to 743 in contact with the side faces of the conductive layers 716 to 725 are formed (see FIG. 14C). Concurrently with the formation of the insulating layers 739 to 743, insulating layers 734 to 738 are formed by etching the insulating layer 705. The insulating layers 739 to 743 are used as masks for doping in the formation of an LDD (Lightly Doped Drain) region subsequently.

Then, using the mask formed of a resist using photolithography and the insulating layers 739 to 743 as masks, an impurity element imparting N-type conductivity is added into the crystalline semiconductor layers 706, and 708 to 710 so that first N-type impurity regions (also referred to as LDD regions) 727, 729, 731, and 733 and second N-type impurity regions (also referred to as source and drain regions) 726, 728, 730, and 732 are formed. The concentration of the impurity element in the first N-type impurity regions 727, 729, 731, and 733 is lower than the concentration of the impurity element in the second N-type impurity regions 726, 728, 730, and 732. Through the above-described steps, N-type thin film transistors 744, and 746 to 748 and a p-type thin film transistor 745 are completed.

It is to be noted that there is a method in which a sidewall insulating layer is used as a mask for forming the LDD region. The method in which a sidewall insulating layer is used as a mask makes it easy to control the width of the LDD region, and the LDD region can be formed without fail.

Figure 15A:
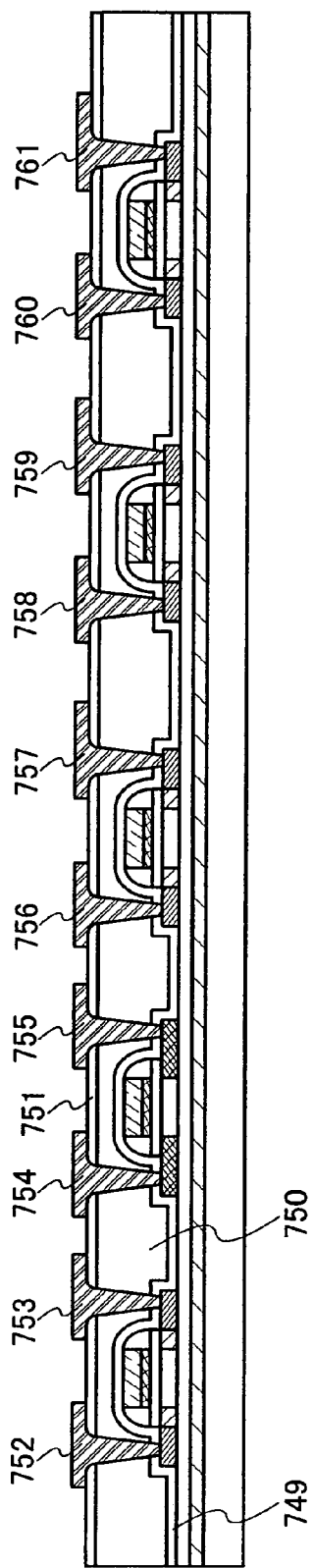
FIGS. 15A and 15B show steps of manufacturing a semiconductor device.

Then, an insulating layer is formed in a single layer or layered structure so as to cover the thin film transistors 744 to 748 (FIG. 15A). The insulating layer covering the thin film transistors 744 to 748 is formed with a single layer or a stack using an inorganic material such as oxide of silicon or nitride of silicon, an organic material such as polyimide, polyamide, benzocyclobutene, acrylic, epoxy resin, and siloxane, or the like by an SOG method, a droplet discharge method, or the like. For example, in the case where the insulating layer covering the thin film transistors 744 to 748 has a three-layer structure, a layer containing silicon oxide may be formed as a first-layer insulating layer 749, preferably, a layer containing a resin may be formed as a second-layer insulating layer 750, and a layer containing silicon nitride may be formed as a third-layer insulating layer 751.

It is to be noted that before the insulating layers 749 to 751 are formed or after one or more of thin layers of the insulating layers 749 to 751 are formed, heat treatment for recovering the crystallinity of the semiconductor layer, for activating the impurity element which has been added into the semiconductor layer, or for hydrogenating the semiconductor layer is preferably performed. For the heat treatment, thermal annealing, laser annealing, RTA, or the like is preferably used.

Then, the insulating layers 749 to 751 are etched by using photolithography to form contact holes so that the N-type impurity regions 726, 728, 730 and 732 and the p-type impurity region 712 are exposed. Subsequently, a conductive layer is formed so as to fill the contact holes and patterned to form conductive layers 752 to 761 each functioning as a source or drain wiring.

The conductive layers 752 to 761 are formed with a single layer or a stack using an element selected from titanium (Ti), aluminum (Al), or neodymium (Nd); an alloy material or a compound material containing the above-described element as its main component by plasma CVD or sputtering. An alloy material containing aluminum as its main component is an alloy material containing nickel whose main component is aluminum or an alloy material containing nickel and one or both of carbon and silicon whose main component is aluminum, for example. Each of the conductive layers 752 to 761 preferably uses, for example, a layered structure of a barrier layer, an aluminum-silicon (Al—Si) layer, and a barrier layer, or a layered structure of a barrier layer, an aluminum-silicon (Al—Si) layer, a titanium nitride layer, and a barrier layer. It is to be noted that a barrier layer corresponds to a thin layer formed using titanium, nitride of titanium, molybdenum, or nitride of molybdenum. Aluminum and aluminum silicon which have low resistance and are inexpensive, so that they are suitable for forming the conductive layers 752 to 761. In addition, generation of a hillock of aluminum or aluminum silicon can be prevented when upper and lower barrier layers are provided. Further, when the barrier layer containing titanium that is a highly-reducible element is formed, even if a thin natural oxide layer is formed on the crystalline semiconductor layer, the natural oxide film is reduced so that preferable contact with the crystalline semiconductor layer can be obtained.

Figure 15B:
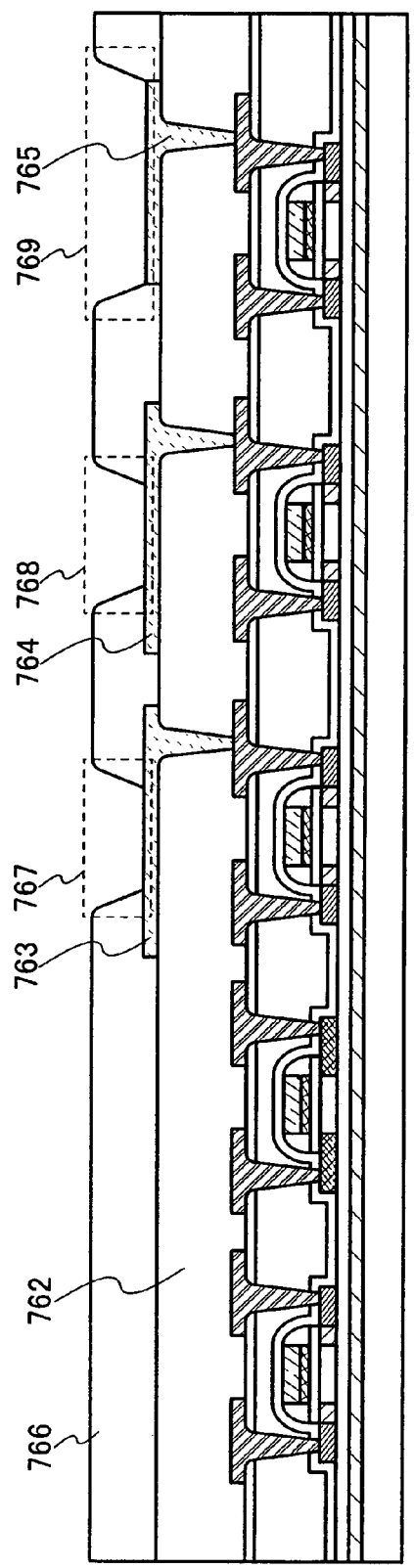

Next, an insulating layer 762 is formed so as to cover the conductive layers 752 to 761 (FIG. 15B). The insulating layer 762 is formed with a single layer or a stack using an inorganic material or an organic material by an SOG method, a droplet discharge method, or the like. The insulating layer 762 is preferably formed to a thickness of 0.75 µm to 3 µm.

Subsequently, the insulating layer 762 is etched by using photolithography to form contact holes in which the conductive layers 757, 759, and 761 are exposed. Then, a conductive layer is formed so as to fill the contact holes. The conductive layer is formed by plasma CVD or sputtering using a conductive material. The conductive layer is patterned to form conductive layers 763 to 765. It is to be noted that each of the conductive layers 763 and 764 corresponds to one of a pair of conductive layers included in a memory element. Therefore, the conductive layers 763 to 765 are preferably formed with a single layer or a stack using titanium, an alloy material or a compound material containing titanium as its main component. Titanium which has low resistance, which enables size reduction of the memory element, thereby high integration can be realized. In addition, in an etching process for forming the conductive layers 763 to 765, it is preferable to perform wet etching in order to prevent damage to the thin film transistors 744 to 748 that are lower layers; hydrogen fluoride (HF) or mixed solution of ammonia and oxygenated water ($NH_3$ and $H_2O_2$) is preferably used as the etchant.

Then, an insulating layer 766 is formed so as to cover the conductive layers 763 to 765. The insulating layer 766 is formed with a single layer or a stack using an inorganic material or an organic material by an SOG method, a droplet discharge method, or the like. In addition, the insulating layer 766 is preferably formed to a thickness of 0.75 µm to 3 µm. The insulating layer 766 is then etched by using photolithography to form contact holes 767 to 769 in which the conductive layers 763 to 765 are respectively exposed.

Figure 16A:
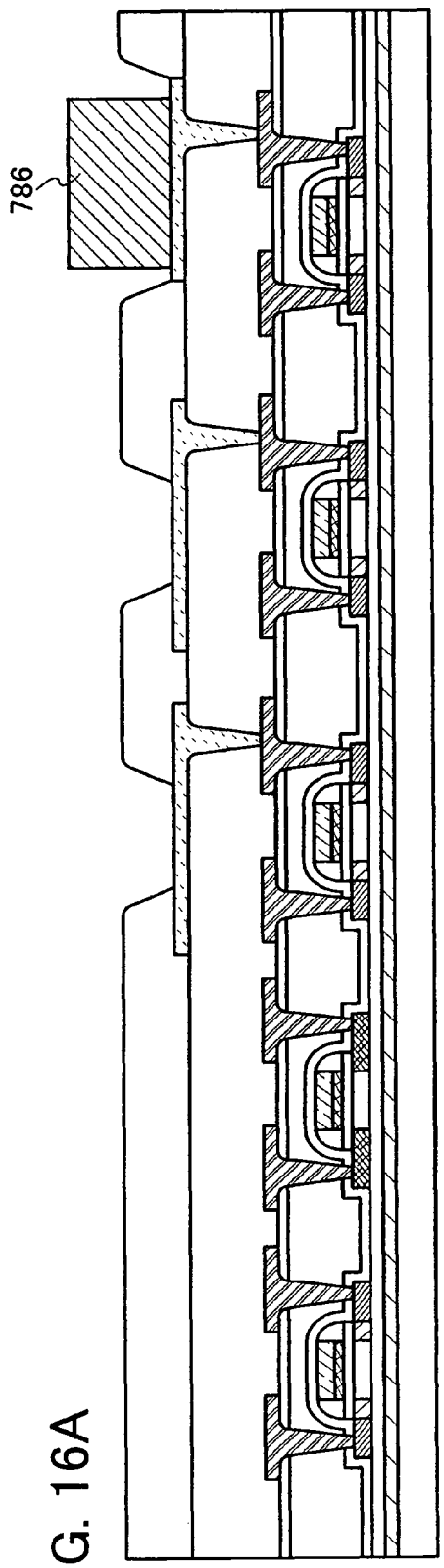
FIGS. 16A and 16B show steps of manufacturing a semiconductor device.

Subsequently, a conductive layer 786 functioning as an antenna which is in contact with the conductive layer 765 is formed (FIG. 16A). The conductive layer 786 is formed by plasma CVD, sputtering, printing, a droplet discharge method, or the like using a conductive material. Preferably, the conductive layer 786 is formed with a single layer or a stack using an element selected from aluminum (Al), titanium (Ti), silver (Ag), or copper (Cu), an alloy material or a compound material containing the above-described element as its main component. Specifically, the conductive layer 786 is formed by screen printing using a paste containing silver and heat treatment thereafter at 50° C. to 350° C. Alternatively, an aluminum layer is formed by sputtering, and is patterned to form the conductive layer 786. The patterning of the aluminum layer is preferably performed by wet etching, and heat treatment at 200° C. to 300° C. is preferably conducted after the wet etching.

Figure 16B:
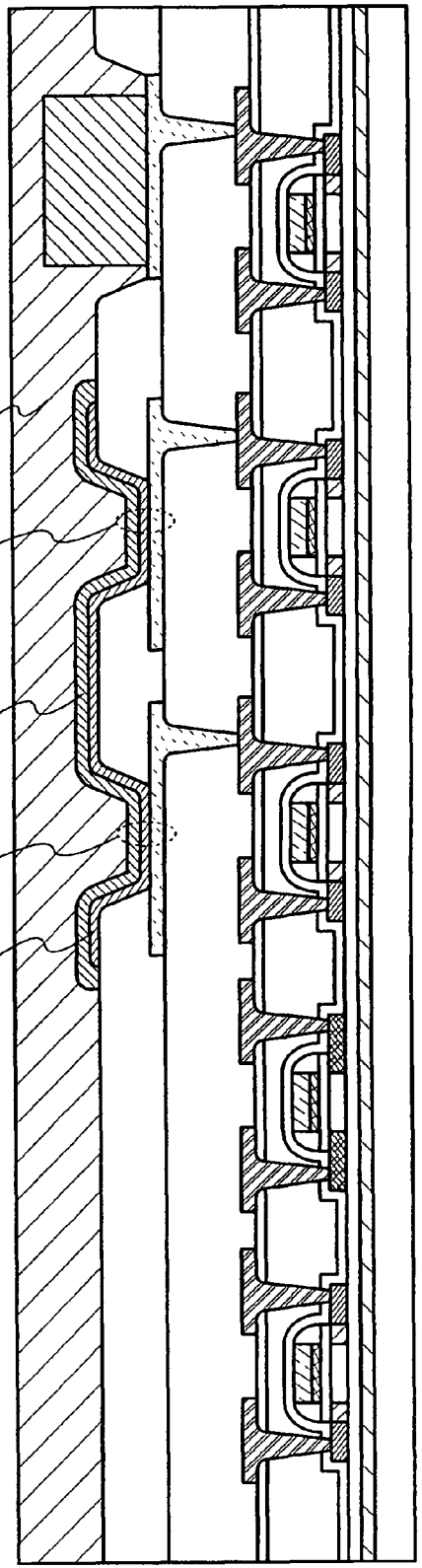

Next, an organic compound layer 787 is formed in contact with the conductive layers 763 and 764 (FIG. 16B). The organic compound layer 787 is formed by a droplet discharge method, spin coating, screen printing, or the like. Subsequently, a conductive layer 771 is formed in contact with the organic compound layer 787. The conductive layer 771 is formed by sputtering, vapor deposition, or the like.

Through the above-described steps, a memory element 789 which includes the conductive layer 763, the organic compound layer 787, and the conductive layer 771, and a memory element 790 which includes the conductive layer 764, the organic compound layer 787, and the conductive layer 771 are completed.

It is to be noted that according to the manufacturing steps described above, the step for forming the organic compound layer 787 is carried out after the step for forming the conductive layer 786 functioning as an antenna because the heat resistance of the organic compound layer 787 is not high.

Subsequently, an insulating layer 772 functioning as a protective film is formed by an SOG method, a droplet discharge method, or the like so as to cover the memory elements 789 and 790 and the conductive layer 786 functioning as an antenna. The insulating layer 772 is formed with a layer containing carbon such as DLC (Diamond Like Carbon), a layer containing silicon nitride, a layer containing silicon nitride oxide, an organic material, or preferably formed of an epoxy resin.

Figures 17A, 17B:
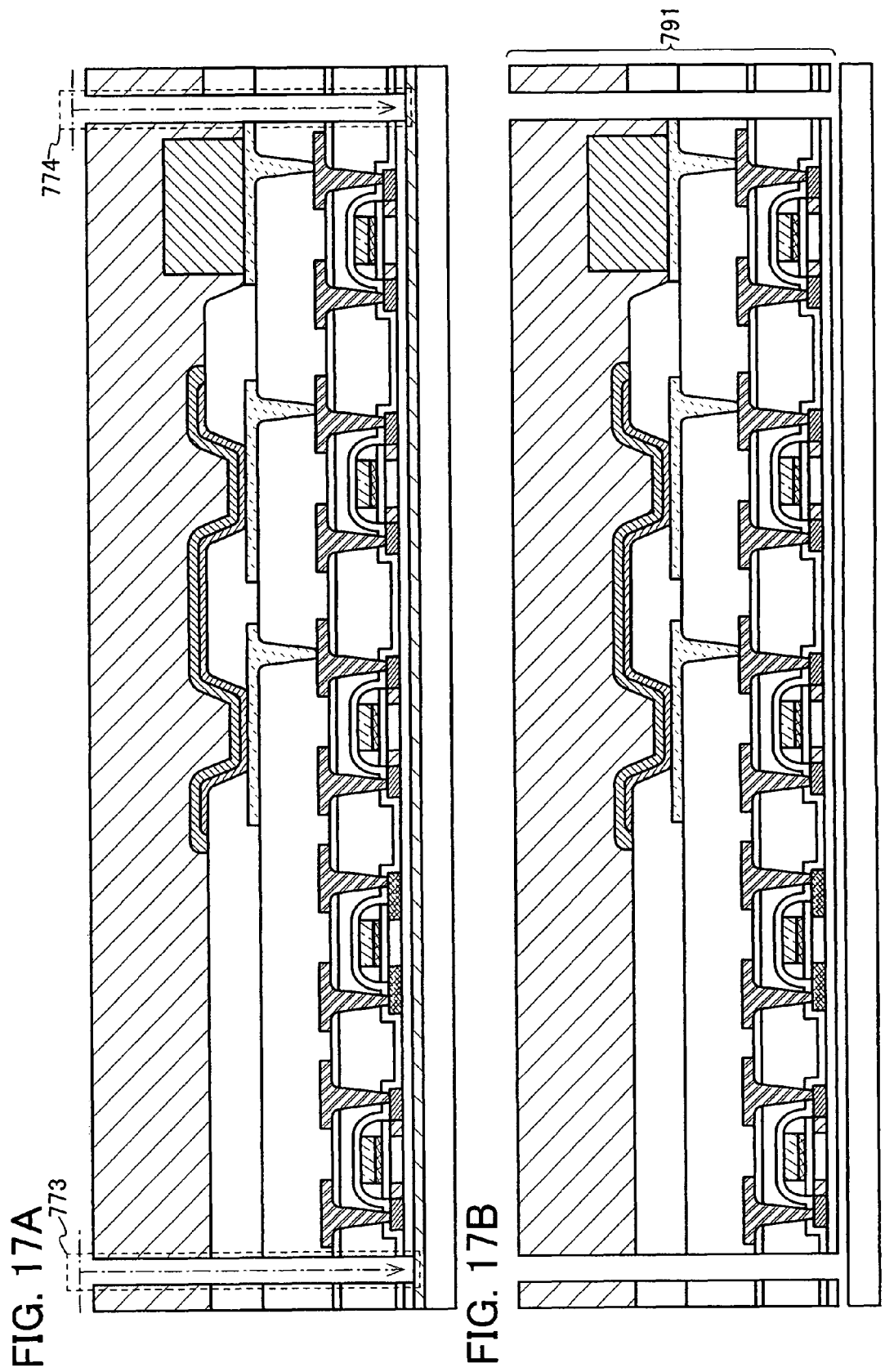
FIGS. 17A and 17B show steps of manufacturing a semiconductor device.

Next, thin film integrated circuits 791 are peeled off from the substrate 701. Here, forming openings 773 and 774 by irradiation with laser beams (for example, UV light) (FIG. 17A), the thin film integrated circuits 791 can be peeled off from the substrate 701 by physical force. Alternatively, after forming the openings 773 and 774, an etchant may be introduced into the openings 773 and 774 to remove the release layer 702 before peeling off the thin film integrated circuits 791 from the substrate 701 (FIG. 17B). As the etchant, a gas or a liquid containing halogen fluoride or an interhalogen compound is used; for example, chlorine trifluoride ($ClF_3$) is used as a gas containing halogen fluoride. Accordingly, a thin film integrated circuit 791 is separated from the substrate 701. The release layer 702 may be partially left without being removed entirely. When a part of the release layer 702 is left, the consumption of the etchant is reduced and processing time required for removing the release layer can be suppressed. Further, after removing the release layer, the thin film integrated circuits 791 can be held over the substrate 701.

It is preferable to reuse the substrate 701 after the thin film integrated circuit 791 is separated, thereby reducing the cost. In addition, the insulating layer 772 is formed to prevent the thin film integrated circuit 791 from scattering after the release layer 702 is removed. The thin film integrated circuit 791 which is small, thin, and light easily scatters after the release layer 702 is removed since it is not attached firmly to the substrate 701. However, by forming the insulating layer 772 on the thin film integrated circuit 791, the thin film integrated circuit 791 is weighed and scattering from the substrate 701 can be prevented. In addition, by forming the insulating layer 772, the thin film integrated circuit 791 which is thin and light alone is not rolled after the substrate 701 is separated, and strength can be ensured.

Figure 18:
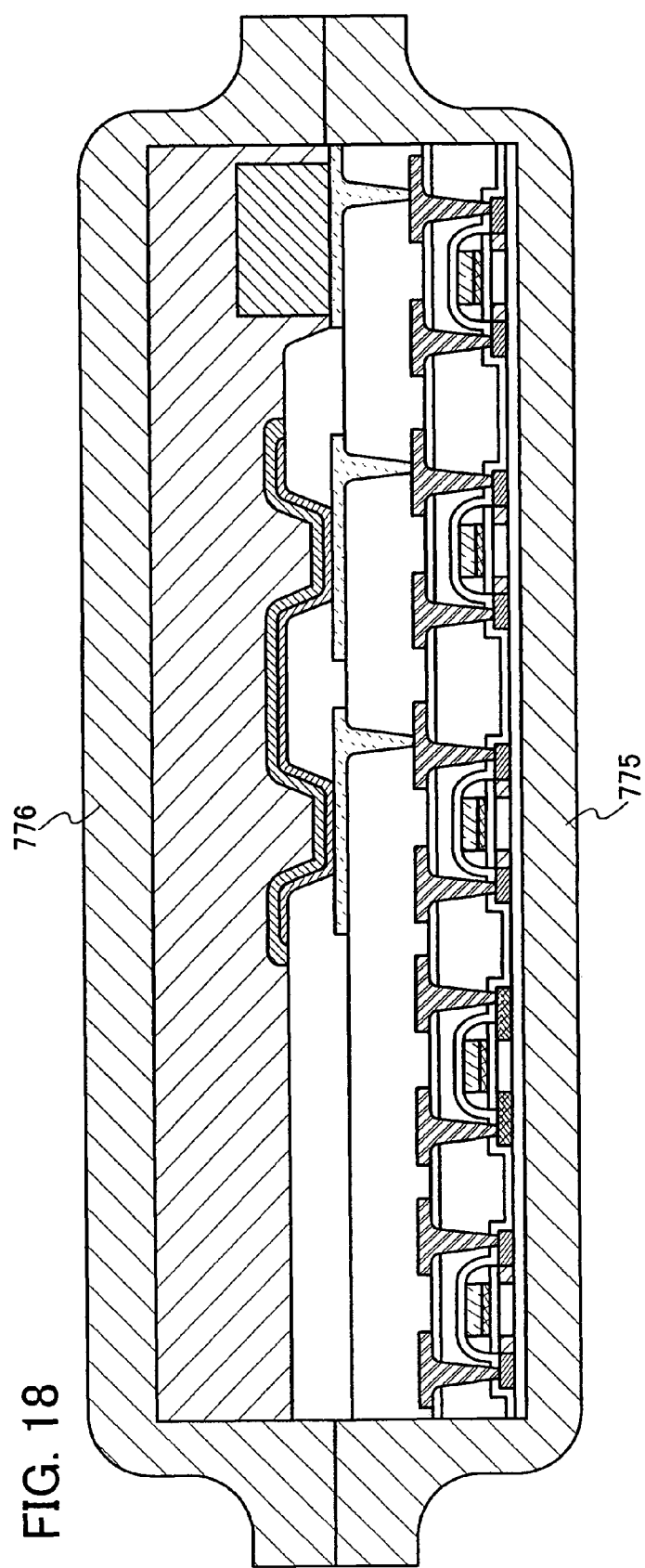
FIG. 18 shows a step of manufacturing a semiconductor device.

Subsequently, one surface of the thin film integrated circuit 791 is attached to a first support 776, and the thin film integrated circuit 791 is completely peeled off from the substrate 701 (FIG. 18). Then, a second support 775 is provided on the other surface of the thin film integrated circuit 791, and one or both of heat treatment and pressure treatment are performed to seal the thin film integrated circuit 791 with the first support 776 and the second support 775. Each of the first support 776 and the second support 775 may be a film formed of polypropylene, polyester, vinyl, polyvinyl fluoride, polyvinyl chloride, or the like, paper of a fibrous material, a film stack of a base film (polyester, polyamide, an inorganic vapor deposition film, paper, or the like) and an adhesive synthetic resin film (an acrylic-based synthetic resin, an epoxy-based synthetic resin, or the like), or the like. The films are bonded by thermocompression bonding. An adhesive layer which is provided on the outermost surface of the adhesive layer or a layer (not an adhesive layer) which is provided on the outermost layer thereof is melted by heart treatment, and then is pressured, so that the films are attached. An adhesive layer may be provided on a surface of the first support 776 or the second support 775, or it may not be provided. The adhesive layer is a layer containing an adhesive such as a heat curable resin, an ultraviolet-curable resin, an epoxy resin-based adhesive, or a resin additive.

Through the above steps, a semiconductor device having a memory element and an antenna can be manufactured. Further, through the above steps, a flexible semiconductor device can be obtained.

Embodiment Mode 9

The semiconductor device according to any one of Embodiment Modes 1 to 8 can be utilized as an RFID tag. For example, the semiconductor device can be used by being provided on paper money, coin, securities, certificates, bearer bonds, packing containers, documents, recording media, commodities, vehicles, foods, garments, health articles, livingwares, medicines, electronic apparatuses, and the like. Examples of those will be explained with reference to FIGS. 19A to 19H.

The paper money and coins are money distributed in the market and include currency (cash vouchers) available in a certain area in a similar way to money, and memorial coins. The securities refer to checks, stock certificates, promissory notes, and the like (FIG. 19A). The certificates refer to driver's licenses, certificates of residence, and the like (FIG. 19B). The bearer bonds refer to stamps, rice coupons, various merchandise coupons, and the like (FIG. 19C). The packing containers refer to wrapping paper for a box lunch, plastic bottles, and the like (FIG. 19D). The documents refer to volumes, books and the like (FIG. 19E). The recording media refer to DVD software, video tapes, and the like (FIG. 19F). The vehicles refer to wheeled vehicles such as bicycles, vessels, and the like (FIG. 19G). The commodities refer to bags, glasses, and the like (FIG. 19H). The foods refer to eatables, drinks, and the like. The garments refer to clothes, chaussures, and the like. The health articles refer to medical appliances, health appliances, and the like. The livingwares refer to furniture, lighting equipment, and the like. The medicines refer to medical products, pesticides, and the like. The electronic apparatuses refer to liquid crystal display apparatuses, EL display apparatuses, television apparatuses (TV sets or flat-screen televisions), cellular phones, and the like.

Counterfeits can be prevented by providing an RFID tag on the paper money, coin, securities, certificates, bearer bonds, and the like. The efficiency of an inspection system or a system used in a rental shop can be improved by providing an RFID tag on packing containers, documents, recording media, commodities, foods, livingwares, electronic apparatuses, or the like. When an RFID tag is provided on each of the vehicles, health articles, medicines, and the like, counterfeits or theft can be prevented, further, medicines can be prevented from being taken mistakenly. The RFID tag is provided on goods by being pasted on their surfaces or embedded thereinto. For example, the RFID tag may be embedded in a paper in the case of a book or embedded in an organic resin in the case of a package formed of the organic resin. In the case of writing (additionally writing) by optical operation afterward, a transparent material is preferably used so that a memory element provided on a chip is exposed to light. Further, counterfeits can be effectively prevented by using a memory element in which once-written data cannot be changed. Problems such as privacy after a user purchases a product can be solved by providing a system for erasing data of a memory element provided on an RFID tag.

The efficiency of an inspection system, a system used in a rental shop, or the like can be improved by providing an RFID tag on, for example, packing containers, recording media, commodities, foods, garments, livingwares, electronic apparatuses, or the like. Counterfeits or theft can be prevented by providing an RFID tag on vehicles. Individual creatures can be easily identified by implanting an RFID tag equipped with a sensor in creatures such as animals. For example, health status such as body temperature in addition to year of birth, sex, breed, and the like can be easily managed by implanting an RFID tag in creatures such as domestic animals.

This application is based on Japanese Patent Application serial No. 2006-041292 filed in Japan Patent Office on Feb. 17, 2006, the entire contents of which are hereby incorporated by reference.

What is claimed is:

1. A method for manufacturing a semiconductor device comprising:
    forming a first conductive layer over a substrate;
    forming an organic compound layer over the first conductive layer;
    forming a second conductive layer over the organic compound layer;
    emitting a laser beam from a laser oscillator;
    splitting the laser beam into a plurality of diffracted laser beams having substantially a same energy by making the laser beam go through a diffractive optical element made of a phase grating; and
    irradiating discretely the organic compound layer with the plurality of diffracted laser beams from according to an arbitrary pattern;
    wherein a plurality of regions of the organic compound layer are selectively irradiated with the plurality of diffracted laser beams according to the arbitrary pattern, thereby electrical resistance between the first conductive layer and the second conductive layer is partially changed so as to write data corresponding to the regions in a memory circuit comprising the organic compound layer.

2. A method for manufacturing a semiconductor device according to claim 1,
    wherein the organic compound layer is formed by spin coating, screen printing, or a droplet discharge method.

3. A method for manufacturing a semiconductor device according to claim 1,
    wherein the diffractive optical element is a transmissive diffractive optical element or a reflective diffractive optical element.

4. A method for manufacturing a semiconductor device comprising:
    forming a first conductive layer over a substrate provided with a transistor, wherein the first conductive layer is connected to the transistor;
    forming an organic compound layer over the first conductive layer;
    forming a second conductive layer over the organic compound layer;
    emitting a laser beam from a laser oscillator;
    splitting the laser beam into a plurality of diffracted laser beams having substantially a same energy by making the laser beam go through a diffractive optical element made of a phase grating; and
    irradiating discretely the organic compound layer with the plurality of diffracted laser beams according to an arbitrary pattern;
    wherein a plurality of regions of the organic compound layer are selectively irradiated with the plurality of diffracted laser beams according to the arbitrary pattern, thereby electrical resistance between the first conductive layer and the second conductive layer is partially changed so as to write data corresponding to the regions in a memory circuit comprising the organic compound layer.

5. A method for manufacturing a semiconductor device according to claim 4,
    wherein the organic compound layer is formed by spin coating, screen printing, or a droplet discharge method.

6. A method for manufacturing a semiconductor device according to claim 4,
    wherein the diffractive optical element is a transmissive diffractive optical element or a reflective diffractive optical element.

7. A method for manufacturing a semiconductor device comprising:
    forming a first conductive layer over a substrate;
    forming an organic compound layer over the first conductive layer; forming a second conductive layer over the organic compound layer;
    introducing a laser beam emitted from a laser oscillator into a deflector;
    splitting the laser beam into a plurality of diffracted laser beams having substantially a same energy by making the laser beam coming out of the deflector go through a diffractive optical element made of a phase grating; and
    irradiating discretely the organic compound layer with the plurality of diffracted laser beams according to an arbitrary pattern;
    wherein a plurality of regions of the organic compound layer are selectively irradiated with the plurality of diffracted laser beams according to the arbitrary pattern, thereby electrical resistance between the first conductive layer and the second conductive layer is partially changed so as to write data corresponding to the regions in a memory circuit comprising the organic compound layer.

8. A method for manufacturing a semiconductor device according to claim 7,
    wherein the organic compound layer is formed by spin coating, screen printing, or a droplet discharge method.

9. A method for manufacturing a semiconductor device according to claim 7,
    wherein the diffractive optical element is a transmissive diffractive optical element or a reflective diffractive optical element.

10. A method for manufacturing a semiconductor device comprising: forming a first conductive layer over a substrate provided with a transistor, wherein the first conductive layer is connected to the transistor; forming an organic compound layer over the first conductive layer; forming a second conductive layer over the organic compound layer; introducing a laser beam emitted from a laser oscillator into a deflector; splitting the laser beam into a plurality of diffracted laser beams having substantially a same energy by making the laser beam coming out of the deflector go through a diffractive optical element made of a phase grating; and
    irradiating discretely the organic compound layer with the plurality of diffracted laser beams according to an arbitrary pattern;
    wherein a plurality of regions of the organic compound layer are selectively irradiated with the plurality of diffracted laser beams according to the arbitrary pattern, thereby electrical resistance between the first conductive layer and the second conductive layer is partially changed so as to write data corresponding to the regions in a memory circuit comprising the organic compound layer.

11. A method for manufacturing a semiconductor device according to claim 10,
    wherein the organic compound layer is formed by spin coating, screen printing, or a droplet discharge method.

12. A method for manufacturing a semiconductor device according to claim 10,
wherein the diffractive optical element is a transmissive diffractive optical element or a reflective diffractive optical element.

13. A method for manufacturing a semiconductor device comprising:
forming a first conductive layer over a substrate;
forming an organic compound layer over the first conductive layer;
forming a second conductive layer over the organic compound layer;
emitting a laser beam from a laser oscillator;
splitting the laser beam into a plurality of diffracted laser beams having substantially a same energy by making the laser beam go through a diffractive optical element made of a phase grating;
introducing the plurality of diffracted laser beams transmitted through the diffractive optical element into a digital micromirror device having a plurality of micromirrors;
introducing the plurality of diffracted laser beams reflected by the plurality of micromirrors into a projection lens, and irradiating discretely the organic compound layer with the plurality of diffracted laser beams according to an arbitrary pattern;
wherein a plurality of regions of the organic compound layer are selectively irradiated with the plurality of diffracted laser beams according to the arbitrary pattern, thereby electrical resistance between the first conductive layer and the second conductive layer is partially changed so as to write data corresponding to the regions in a memory circuit comprising the organic compound layer.

14. A method for manufacturing a semiconductor device according to claim 13,
wherein the organic compound layer is formed by spin coating, screen printing, or a droplet discharge method.

15. A method for manufacturing a semiconductor device according to claim 13,
wherein the diffractive optical element is a transmissive diffractive optical element or a reflective diffractive optical element.

16. A method for manufacturing a semiconductor device comprising the steps of:
forming a first conductive layer over a substrate provided with a transistor, wherein the first conductive layer is connected to the transistor;
forming an organic compound layer over the first conductive layer;
forming a second conductive layer over the organic compound layer;
emitting a laser beam from a laser oscillator;
splitting the laser beam into a plurality of diffracted laser beams having substantially a same energy by making the laser beam go through a diffractive optical element made of a phase grating;
introducing the plurality of diffracted laser beams transmitted through the diffractive optical element into a digital micromirror device having a plurality of micromirrors;
introducing the plurality of diffracted laser beams reflected by the plurality of micromirrors into a projection lens, and irradiating discretely the organic compound layer with the plurality of diffracted laser beams according to an arbitrary pattern;
wherein a plurality of regions of the organic compound layer are selectively irradiated with the plurality of diffracted laser beams according to the arbitrary pattern, thereby electrical resistance between the first conductive layer and the second conductive layer is partially changed so as to write data corresponding to the regions in a memory circuit comprising the organic compound layer.

17. A method for manufacturing a semiconductor device according to claim 16,
wherein the organic compound layer is formed by spin coating, screen printing, or a droplet discharge method.

18. A method for manufacturing a semiconductor device according to claim 16,
wherein the diffractive optical element is a transmissive diffractive optical element or a reflective diffractive optical element.

* * * * *

UNITED STATES PATENT AND TRADEMARK OFFICE
CERTIFICATE OF CORRECTION

| | |
|---|---|
| PATENT NO. | : 8,580,700 B2 |
| APPLICATION NO. | : 11/702082 |
| DATED | : November 12, 2013 |
| INVENTOR(S) | : Tanaka et al. |

Page 1 of 1

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 401 days.

Signed and Sealed this
Eighth Day of March, 2016

Michelle K. Lee
*Director of the United States Patent and Trademark Office*